United States Patent
Lee et al.

(10) Patent No.: US 12,439,678 B2
(45) Date of Patent: Oct. 7, 2025

(54) ISOLATION STRUCTURES

(71) Applicant: Taiwan Semiconductor Manufacturing Company, Ltd., Hsinchu (TW)

(72) Inventors: Kai-Hsuan Lee, Hsinchu (TW); Shih-Che Lin, Hsinchu (TW); Po-Yu Huang, Hsinchu (TW); Shih-Chieh Wu, Hsinchu (TW); I-Wen Wu, Hsinchu (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 333 days.

(21) Appl. No.: 17/402,079

(22) Filed: Aug. 13, 2021

(65) Prior Publication Data
US 2023/0048829 A1 Feb. 16, 2023

(51) Int. Cl.
| | |
|---|---|
| *H10D 84/03* | (2025.01) |
| *H01L 21/02* | (2006.01) |
| *H01L 21/764* | (2006.01) |
| *H10D 30/01* | (2025.01) |
| *H10D 30/67* | (2025.01) |

(Continued)

(52) U.S. Cl.
CPC ....... *H10D 84/038* (2025.01); *H01L 21/0259* (2013.01); *H01L 21/764* (2013.01); *H10D 30/031* (2025.01); *H10D 30/6713* (2025.01); *H10D 30/6735* (2025.01); *H10D 30/6757* (2025.01); *H10D 62/118* (2025.01); *H10D 64/017* (2025.01); *H10D 84/0167* (2025.01);

(Continued)

(58) Field of Classification Search
None
See application file for complete search history.

(56) References Cited

U.S. PATENT DOCUMENTS

| 9,536,982 B1 * | 1/2017 | Cheng | H01L 29/517 |
| 11,069,684 B1 * | 7/2021 | Xie | H10D 30/6757 |

(Continued)

OTHER PUBLICATIONS

Yu, Chia-Tu et al., "Reducing Parasitic Capacitance in Semiconductor Devices", U.S. Appl. No. 17/198,774, filed Mar. 11, 2021, Assignee: Taiwan Semiconductor Manufacturing Co., Ltd., 47 pages.

*Primary Examiner* — Sue A Purvis
*Assistant Examiner* — Carnell Hunter, III
(74) *Attorney, Agent, or Firm* — HAYNES AND BOONE, LLP

(57) ABSTRACT

Semiconductor structures and methods are provided. An exemplary method according to the present disclosure includes receiving a fin-shaped structure comprising a first channel region and a second channel region, a first and a second dummy gate structures disposed over the first and the second channel regions, respectively. The method also includes removing a portion of the first dummy gate structure, a portion of the first channel region and a portion of the substrate under the first dummy gate structure to form a trench, forming a hybrid dielectric feature in the trench, removing a portion of the hybrid dielectric feature to form an air gap, sealing the air gap, and replacing the second dummy gate structure with a gate stack after sealing the air gap.

20 Claims, 28 Drawing Sheets

(51) Int. Cl.
*H10D 62/10* (2025.01)
*H10D 64/01* (2025.01)
*H10D 84/01* (2025.01)
*H10D 84/85* (2025.01)

(52) U.S. Cl.
CPC ....... *H10D 84/017* (2025.01); *H10D 84/0188* (2025.01); *H10D 84/85* (2025.01)

(56) References Cited

U.S. PATENT DOCUMENTS

| | | | |
|---|---|---|---|
| 2018/0301564 A1* | 10/2018 | Kwon | H01L 21/764 |
| 2019/0334008 A1* | 10/2019 | Chen | H01L 29/6656 |
| 2020/0105867 A1* | 4/2020 | Lee | H01L 23/10 |
| 2020/0343146 A1* | 10/2020 | Cheng | H10D 64/021 |
| 2021/0098627 A1* | 4/2021 | Liaw | H01L 29/775 |
| 2022/0122893 A1* | 4/2022 | Lai | H01L 29/6653 |
| 2022/0310452 A1* | 9/2022 | Wu | H01L 29/66545 |

* cited by examiner

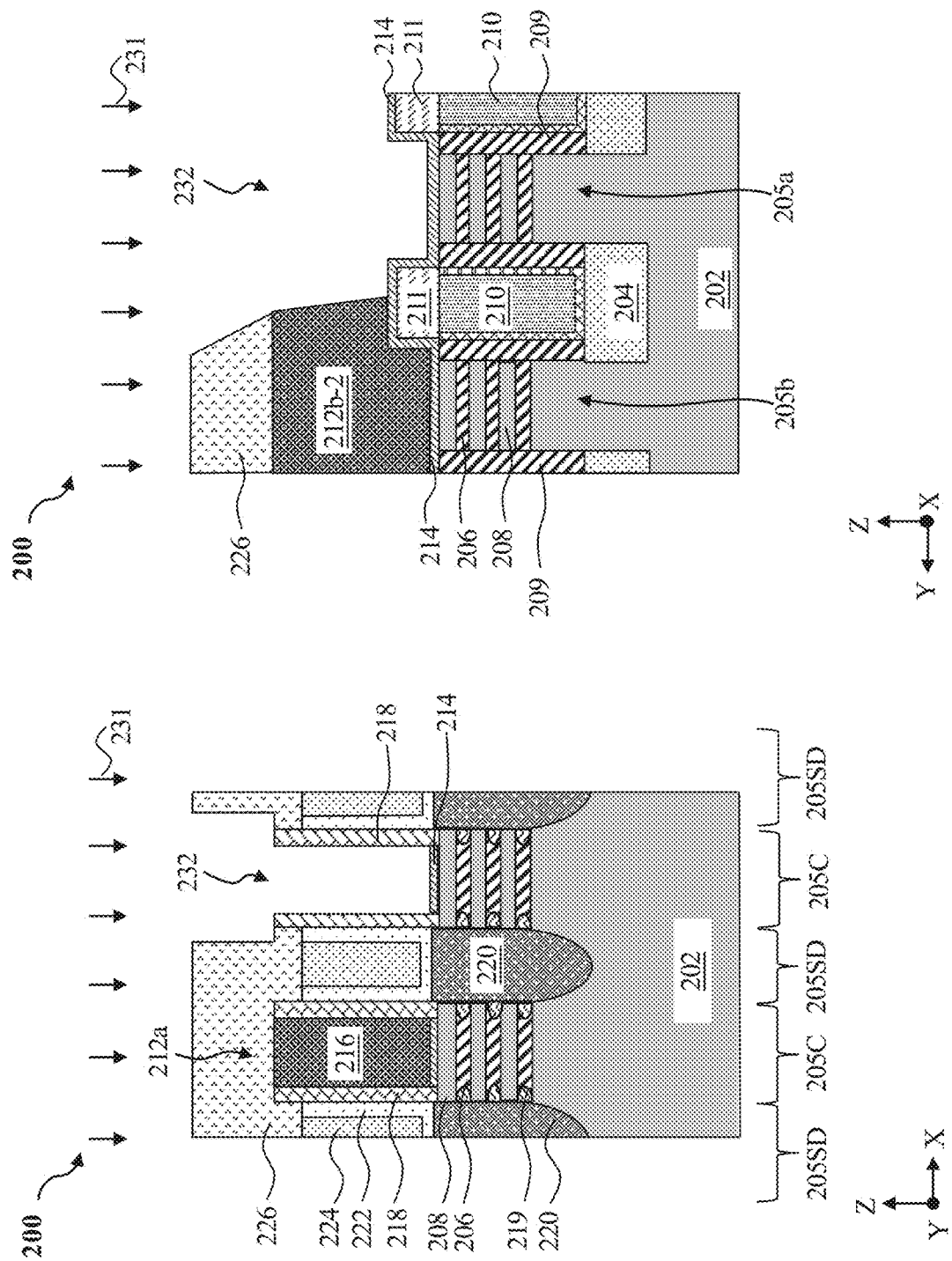

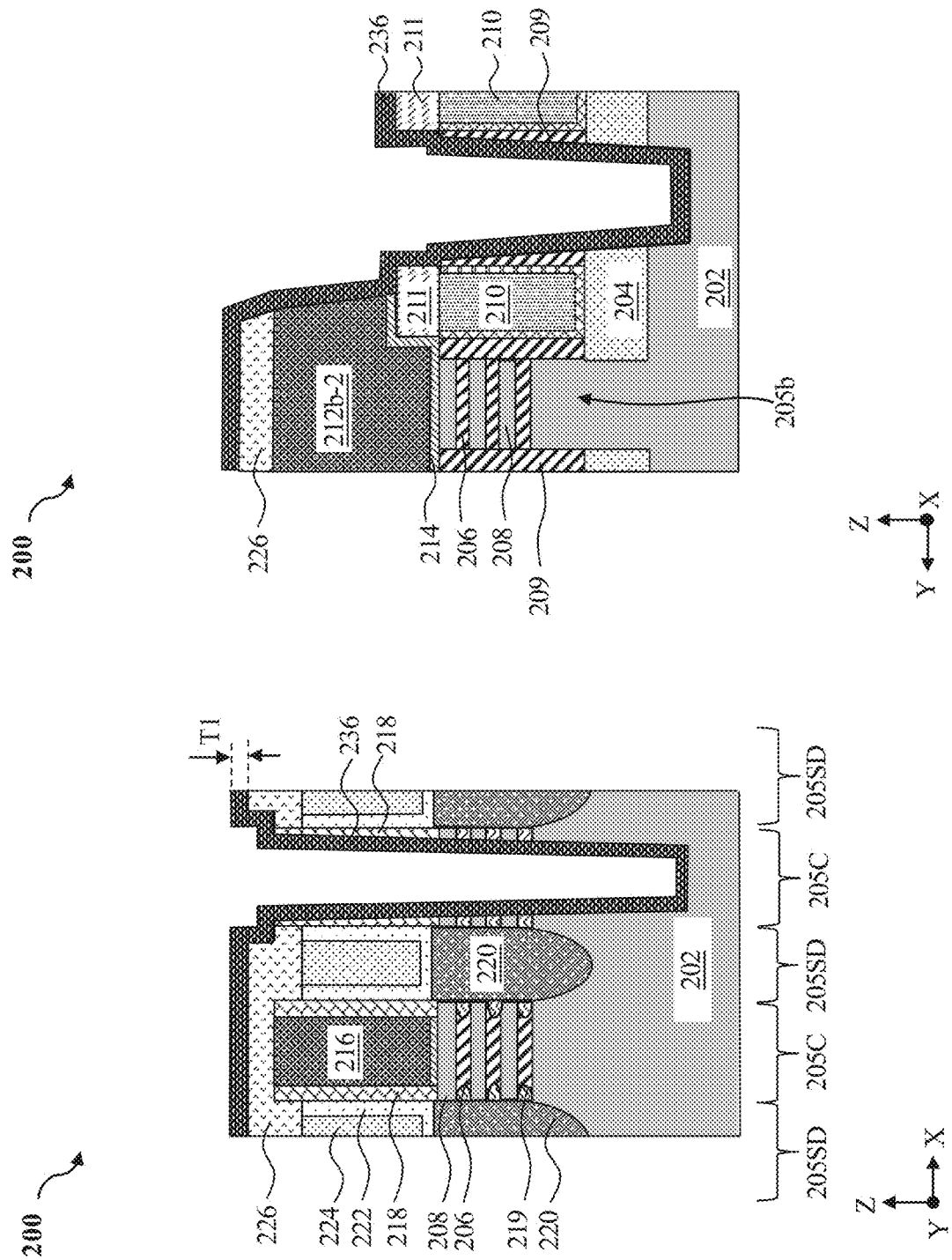

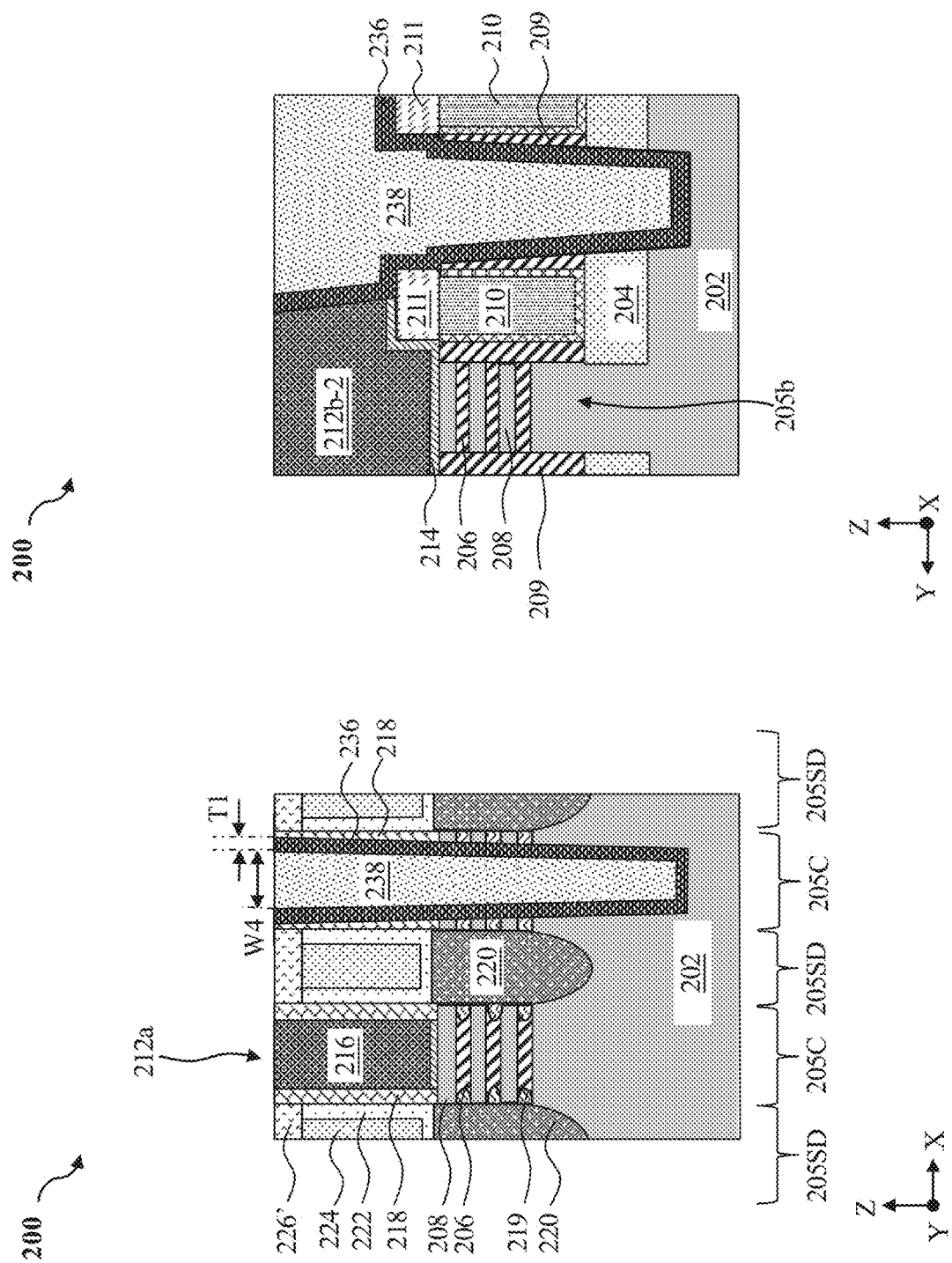

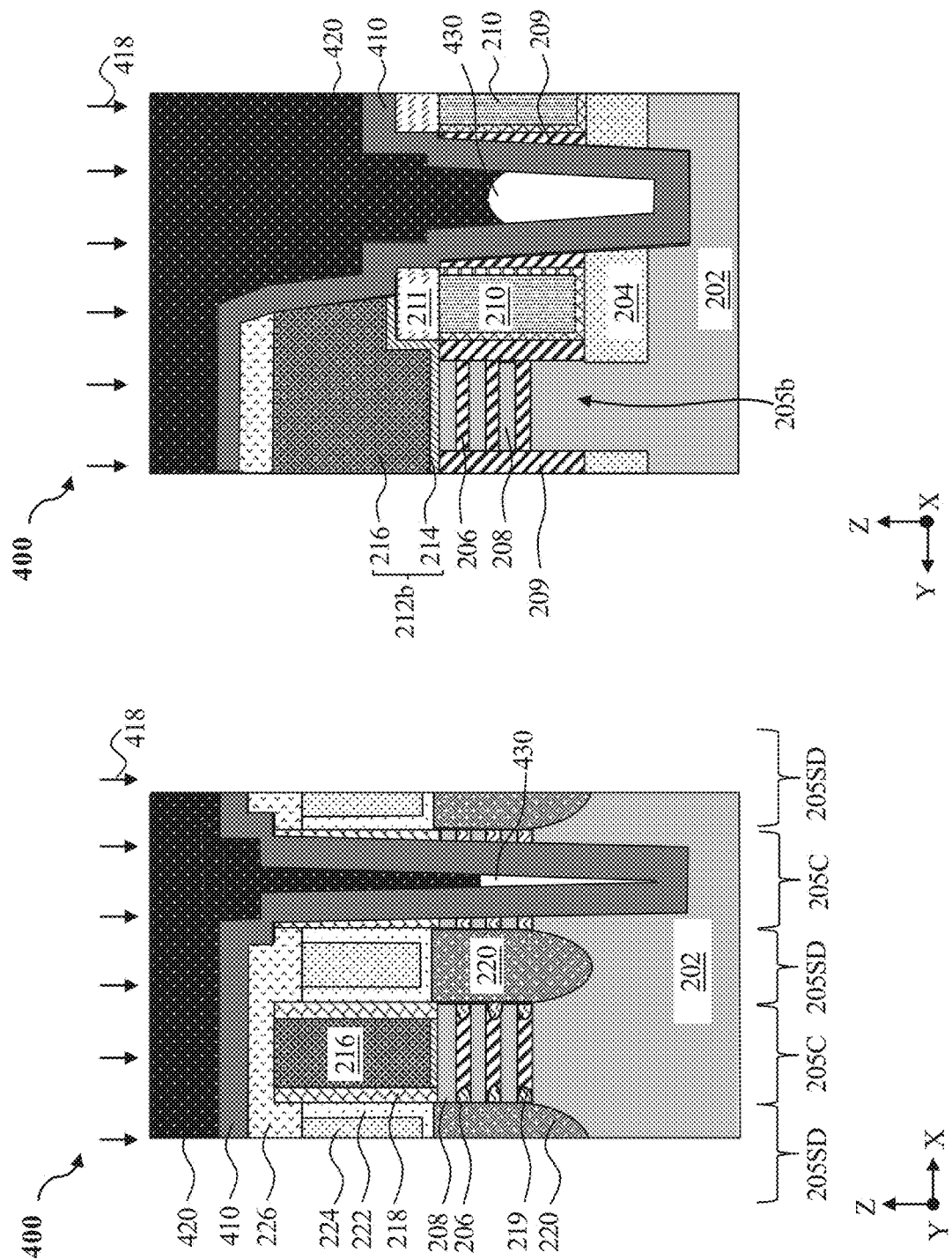

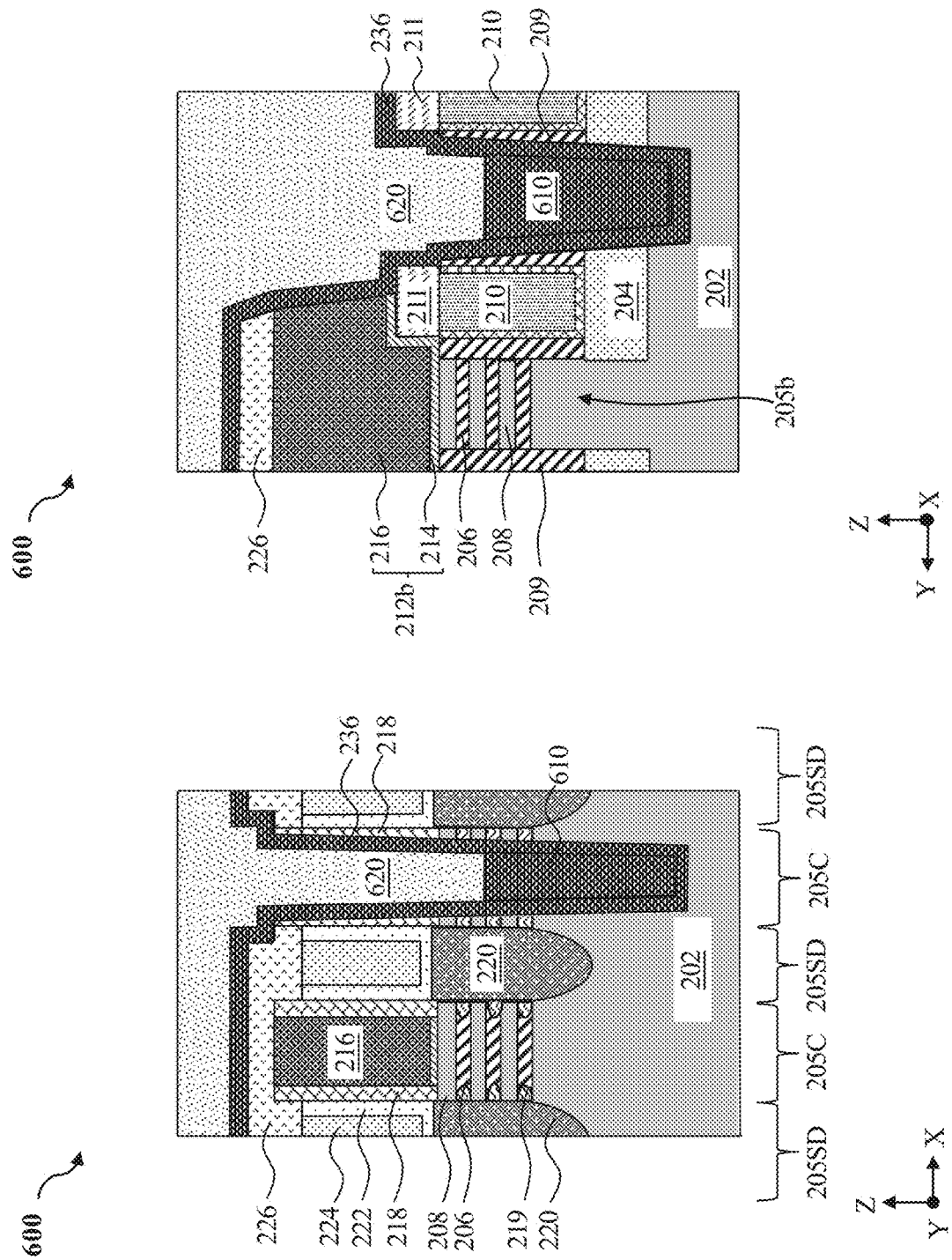

US 12,439,678 B2

ISOLATION STRUCTURES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

Such scaling down has also increased the complexity of processing and manufacturing ICs and, for these advances to be realized, similar developments in IC processing and manufacturing are needed. For example, various methods have been developed to form isolation structures to divide active regions into segments. While existing isolation structures are generally adequate in isolating active region segments, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, and 15A (FIGS. 3A-15A) illustrate fragmentary cross-sectional views of the workpiece taken along line A-A' as shown in FIG. 2 during a fabrication process according to the method of FIG. 1, according to various aspects of the disclosure.

FIGS. 3B, 4B, 5B, 6B, 7B, 8B, 9B, 10B, 11B, 12B, 13B, 14B, and 15B (FIGS. 3B-15B) illustrate fragmentary cross-sectional views of the workpiece taken along line B-B' as shown in FIG. 2 during a fabrication process according to the method of FIG. 1, according to various aspects of the disclosure.

FIGS. 18A, 19A, 20A, 21A, and 22A (FIGS. 18A-22A) illustrate fragmentary alternative cross-sectional views of the workpiece taken along line A-A' as shown in FIG. 2 during a fabrication process according to the method of FIG. 1 and FIG. 17, according to various aspects of the disclosure.

FIGS. 18B, 19B, 20B, 21B, and 22B (FIGS. 18B-22B) illustrate fragmentary alternative cross-sectional views of the workpiece taken along line B-B' as shown in FIG. 2 during a fabrication process according to the method of FIG. 1 and FIG. 17, according to various aspects of the disclosure.

FIGS. 25A, 26A, 27A, and 28A (FIGS. 25A-28A) illustrate fragmentary cross-sectional views of the workpiece taken along line A-A' as shown in FIG. 2 during a fabrication process according to the method of FIG. 1 and FIG. 24, according to various aspects of the disclosure.

FIGS. 25B, 26B, 27B, and 28B (FIGS. 25B-28B) illustrate fragmentary cross-sectional views of the workpiece taken along line B-B' as shown in FIG. 2 during a fabrication process according to the method of FIG. 1 and FIG. 24, according to various aspects of the disclosure.

DETAILED DESCRIPTION

Figure 1:
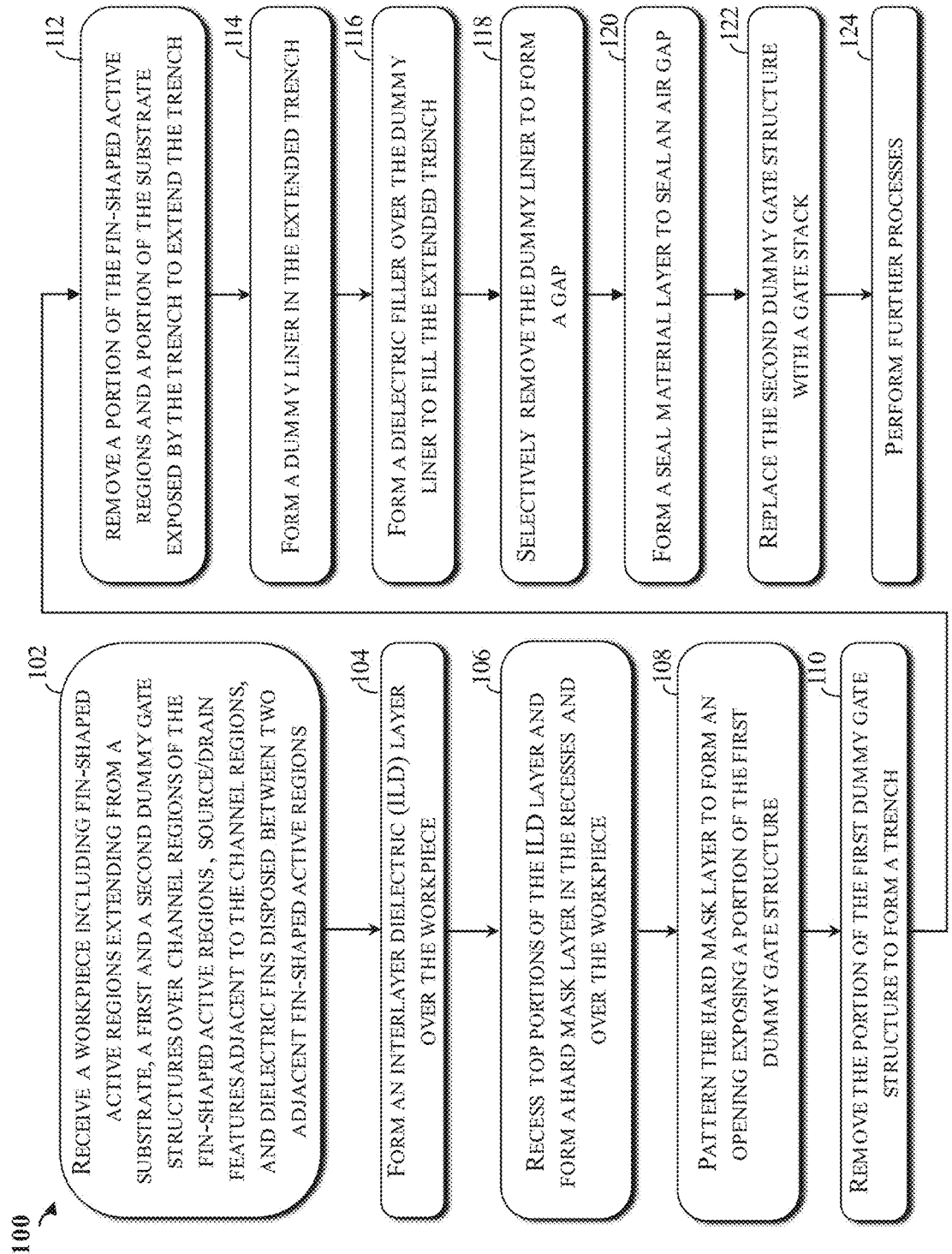
FIG. 1 illustrates a flowchart of an exemplary method for fabricating a semiconductor device, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

Continuous poly on diffusion edge (CPODE) processes have been developed to form isolation structures (may be referred to as CPODE structures or dielectric gates) to divide active regions into segments. CPODE structures and other similar structures are a scaling tool to improve density of devices (e.g., transistors). To achieve desired scaling effect while maintaining the devices' proper functions (e.g., avoiding electrical shorting), the CPODE structures may be formed between boundaries of such devices (i.e., between, for example, S/D contacts formed subsequently over the epitaxial S/D features), such that the separation distance between adjacent devices may be reduced or minimized without compromising device performance. As integrated circuit (IC) technologies progress towards smaller technology nodes, parasitic capacitance may have serious bearings on the overall performance of an IC device. For example, high parasitic capacitance may lead to a lower device speed (e.g., RC delays). When the gate pitch is reduced to meet design requirements of smaller technology nodes, parasitic capacitance associated with the CPODE structure plays an important role in device performance.

The present embodiments are directed to methods of forming a CPODE structure with lowered k values to reduce parasitic capacitance between neighboring active regions. In some embodiments, an exemplary method includes receiving a workpiece including active regions and dummy gate structures over the active regions. One of the dummy gate structure and the active region under the dummy gate structure may be removed to from a CPODE structure trench. A high-k liner layer and a low-k filler layer of a hybrid CPODE structure may be then formed in the trench. The high-k liner layer may be then selectively removed to form an air gap. By providing the CPODE structure with the air gap and the low-k filler layer, parasitic capacitance associated with the CPODE structure may be advantageously reduced, leading to improved device performance.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2, 3A-15A, 3B-15B, and 16, which are fragmentary cross-sectional views or top views of a workpiece 200 at different stages of fabrication according to embodiments of method 100. FIG. 17 and FIG. 24 each includes a flowchart illustrating an alternative method 300 and method 500 of forming a corresponding CPODE structure of the semiconductor structure according to embodiments of the present disclosure, respectively. Method 300 is described below in conjunction with FIGS. 18A-22A, 18B-22B, and 23, which are fragmentary cross-sectional views or top view of a workpiece 400 at different stages of fabrication according to embodiments of method 300. Method 500 is described below in conjunction with FIGS. 25A-28A and 25B-28B, which are fragmentary cross-sectional views of a workpiece 600 at different stages of fabrication according to embodiments of method 500.

Methods 100, 300, and 500 are merely examples and are not intended to limit the present disclosure to what is explicitly illustrated therein. Additional steps may be provided before, during and after the method 100, 300, and/or method 500, and some steps described can be replaced, eliminated, or moved around for additional embodiments of the method. Not all steps are described herein in detail for reasons of simplicity. Because the workpiece 200/400/600 will be fabricated into a semiconductor structure 200/400/600 upon conclusion of the fabrication processes, the workpiece 200/400/600 may be referred to as the semiconductor structure 200/400/600 as the context requires. For avoidance of doubts, the X, Y and Z directions in the figures are perpendicular to one another and are used consistently. Throughout the present disclosure, like reference numerals denote like features unless otherwise excepted.

Referring to FIGS. 1, 2 and 3A-3B, method 100 includes a block 102 where a workpiece 200 is received. The workpiece 200 includes a substrate 202 (shown in FIGS. 3A-3B). In an embodiment, the substrate 202 is a bulk silicon substrate (i.e., including bulk single-crystalline silicon). The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GOI) substrate, and includes a carrier, an insulator on the carrier, and a semiconductor layer on the insulator.

The workpiece 200 also includes multiple fin-shaped structures 205a-205b disposed over the substrate 202. Each of the fin-shaped structures 205a-205b extends lengthwise along the X direction and is divided into channel regions 205C and source/drain regions 205SD. The fin-shaped structures 205a-205b may be formed from a portion of the substrate 202 and a vertical stack of alternating semiconductor layers 206 and 208 using a combination of lithography and etch steps. In the depicted embodiment, the vertical stack of alternating semiconductor layers 206 and 208 includes a number of channel layers 208 interleaved by a number of sacrificial layers 206. Each channel layer 208 may include a semiconductor material such as, silicon, germanium, silicon carbide, silicon germanium, GeSn, SiGeSn, SiGeCSn, other suitable semiconductor materials, or combinations thereof, while each sacrificial layer 206 has a composition different from that of the channel layer 208. In an embodiment, the channel layer 208 includes silicon (Si), the sacrificial layer 206 includes silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In some examples, each of the fin-shaped structures 205a-205b may include a total of three to ten pairs of alternating sacrificial layers 206 and channel layers 208; of course, other configurations may also be applicable depending upon specific design requirements. In alternative embodiments where fin-type field effect transistors (FinFETs) are desired, the fin-shaped structures 205a-205b may include a uniform semiconductor composition along the Z axis and free of the vertical stack as depicted herein.

The workpiece 200 also includes an isolation feature 204 (shown in FIG. 3B) formed around the fin-shaped structures 205a-205b to isolate two adjacent fin-shaped structures. The isolation feature 204 may also be referred to as a shallow trench isolation (STI) feature or a first isolation feature 204. In some embodiments, the STI feature 204 may include silicon oxide, silicon oxynitride, fluorine-doped silicate glass (FSG), a low-k dielectric, combinations thereof, and/or other suitable materials.

Figures 3A, 3B:
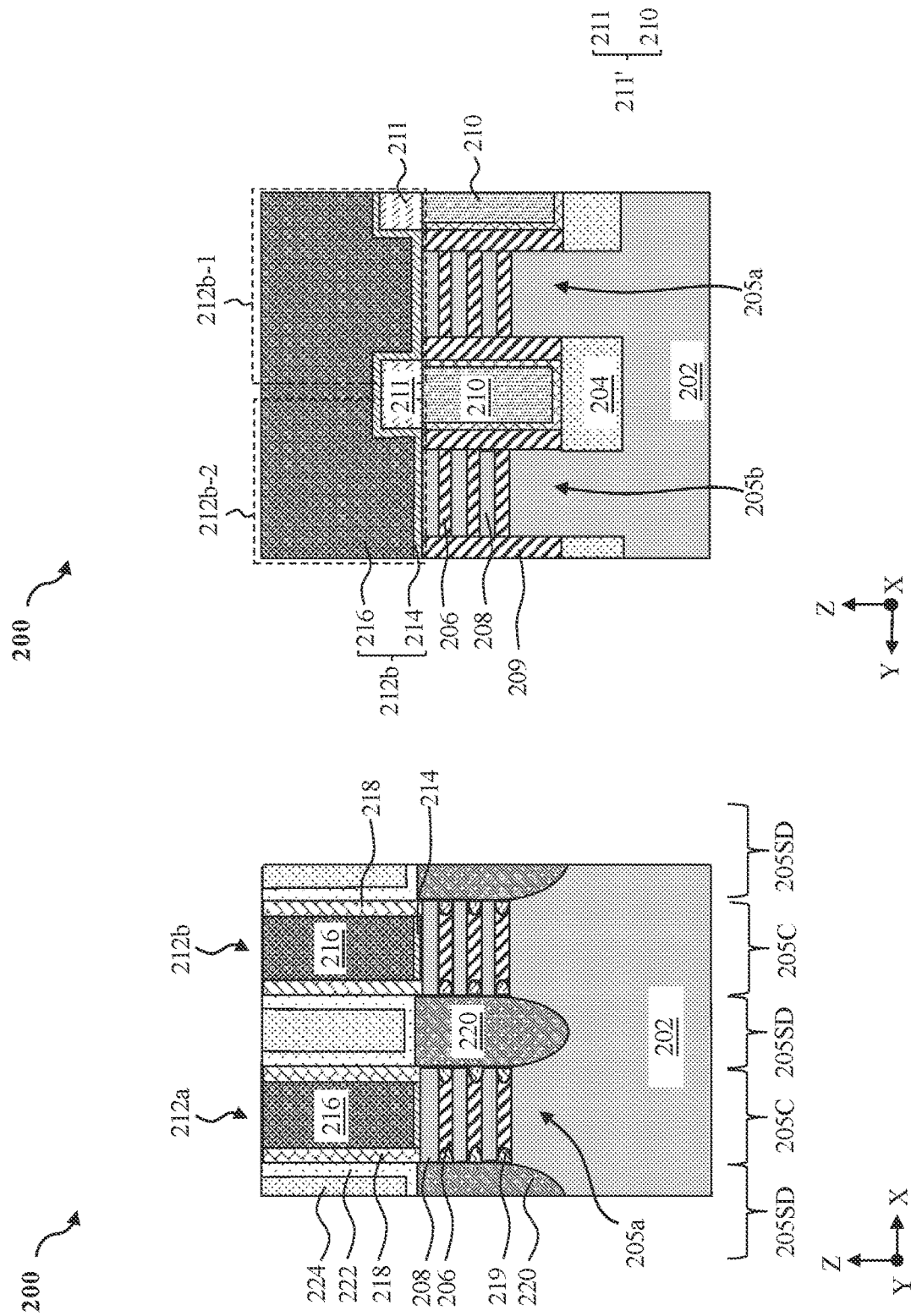

As shown in FIG. 3B, the workpiece 200 also includes a cladding layer 209 extending along sidewall surfaces of each of the fin-shaped structures 205a-205b. The cladding layer 209 may have a composition substantially the same as that of the sacrificial layer 206 such that they may be selectively removed by a common etching process. In the present embodiment, the cladding layer 209 is formed of SiGe. A cladding material layer may be deposited conformally over surfaces of the workpiece 200, and an anisotropic etching process may be then performed to selectively remove portions of the cladding material layer that are not extending along sidewalls of the fin-shaped structures 205a-205b, thereby forming the cladding layer 209.

The workpiece 200 also includes a dielectric fin 210 formed over the STI feature 204 and fills the trench between two cladding layers 209. In an embodiment, a top surface of the dielectric fin 210 is coplanar with a top surface of the topmost channel layer 208. The dielectric fin 210 may be a single-layer structure or a multi-layer structure. In this depicted example, the dielectric fin 210 includes an inner layer and an outer layer surrounding the sidewall and bottom surfaces of the inner layer. The outer layer may include silicon carbon nitride (SiCN), silicon oxycarbonitride (SiOCN), boron nitride (BN), or other suitable materials. The inner layer may include silicon oxide, silicon carbide, FSG, or other suitable dielectric material. The workpiece 200 also includes a helmet layer 211 formed on the dielectric fin 210. That is, a top surface of the helmet layer 211 is higher the top surface of the topmost channel layer 208. The helmet layer 211 may be a high-k (having a dielectric constant greater than that of silicon oxide, which is approximately 3.9) dielectric layer and may include aluminum oxide, aluminum nitride, aluminum oxynitride, zirconium oxide, zirconium nitride, zirconium aluminum oxide, hafnium oxide, other high-k material, or a suitable dielectric material. In some embodiments, the dielectric fin 210 may be referred to as a second isolation feature 210. In some other embodiments, the dielectric fin 210 and the helmet layer 211 may be collectively referred to as a second isolation feature 211'.

Figure 2:
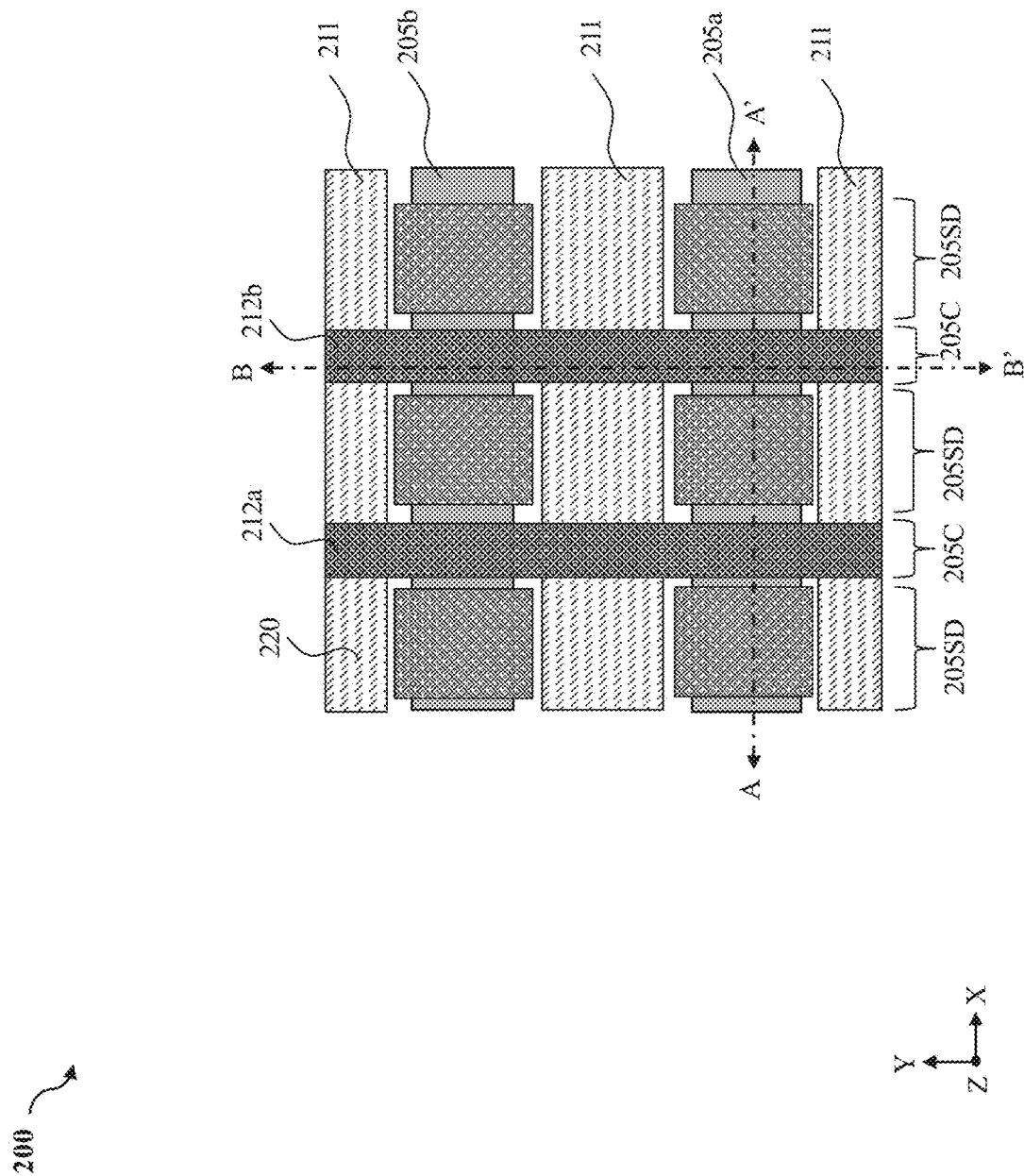
FIG. 2 illustrates a fragmentary top view of an exemplary workpiece to undergo various stages of operations in the methods of FIG. 1, according to various aspects of the disclosure.

Still referring to FIGS. 2 and 3A-3B, the workpiece 200 also includes dummy gate structures 212a-212b disposed over channel regions 205C of the fin-shaped structures 205a-205b. In some embodiments, the dummy gate structures 212a-212b may share substantially the same composition and dimension. The channel regions 205C and the dummy gate structures 212a-212b also define source/drain regions 205SD that are not vertically overlapped by the dummy gate structures 212a-212b. Each of the channel regions 205C is disposed between two source/drain regions 205SD along the X direction. Two dummy gate structures 212a-212b are shown in FIGS. 2 and 3A but the workpiece 200 may include more dummy gate structures. In this embodiment, a gate replacement process (or gate-last process) is adopted where some of the dummy gate structures 212a-212b serve as placeholders for functional gate structures. Other processes for forming the functional gate structures are possible.

In the present embodiments, each of the dummy gate structures 212a-212b includes a dielectric layer 214 (e.g., silicon oxide) and a dummy gate electrode 216 (e.g., polysilicon) disposed over the dielectric layer 214. In embodiments represented in FIG. 3B, the dummy gate structure 212b includes a first portion 212b-1 disposed over the channel region 205C of the fin-shaped structure 205a, and a second portion 212b-2 disposed over the channel region 205C of the fin-shaped structure 205b. As discussed in detail below, at least portions of the dummy gate structure 212a are configured to be replaced with a functional gate stack 250 (shown in FIG. 14B), while at least a portion (e.g., the first portion 212b-1) of the dummy gate structure 212b would be replaced with a CPODE structure 245 (shown in FIG. 13A) to provide an isolation between neighboring active regions.

Still referring to FIG. 3A, the workpiece 200 also includes gate spacers 218 extending along sidewalls of the dummy gate structures 212a-212b. In some embodiments, the gate spacers 218 may include silicon oxide, silicon oxycarbide, silicon carbonitride, silicon nitride, zirconium oxide, aluminum oxide, or a suitable dielectric material. The gate spacers 218 may be a single-layer structure or a multi-layer structure. Additionally, the workpiece 200 also includes inner spacer features 219 disposed between the two adjacent channel layers 208 and in direct contact with sacrificial layers 206 in the channel regions 205C. The inner spacer features 219 may include silicon nitride, silicon oxycarbonitride, silicon carbonitride, silicon oxide, silicon oxycarbide, silicon carbide, or silico oxynitride.

As shown in FIGS. 2 and 3A, the workpiece 200 also includes source/drain features 220 formed in and/or over source/drain regions 205SD and coupled to the channel layers 208 in the channel regions 205C. Depending on the conductivity type of the to-be-formed transistor, the source/drain features 220 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Now referring to FIGS. 1, 3A, and 3B, method 100 includes a block 104 where a contact etch stop layer (CESL) 222 and an interlayer dielectric (ILD) layer 224 are deposited over the workpiece 200. The CESL 222 is configured to protect the various underlying components during subsequent fabrication processes and may include silicon nitride, silicon oxynitride, and/or other suitable materials and may be formed by ALD, chemical vapor deposition (CVD), plasma-enhanced chemical vapor deposition (PECVD) process and/or other suitable deposition or oxidation processes. As shown in FIG. 3A, the CESL 222 may be deposited on top surfaces of the source/drain features 220 and sidewalls of the gate spacer 218. The ILD layer 224 is deposited by a CVD process, a PECVD process or other suitable deposition technique over the workpiece 200 after the deposition of the CESL 222. The ILD layer 224 may include silicon oxide, a low-k dielectric material, TEOS, doped silicon oxide (e.g., BPSG, FSG, PSG, BSG, etc.), other suitable dielectric materials, or combinations thereof. One or more chemical mechanical planarization (CMP) processes may be performed to planarize the top surface of the workpiece 200.

Figures 4A, 4B:
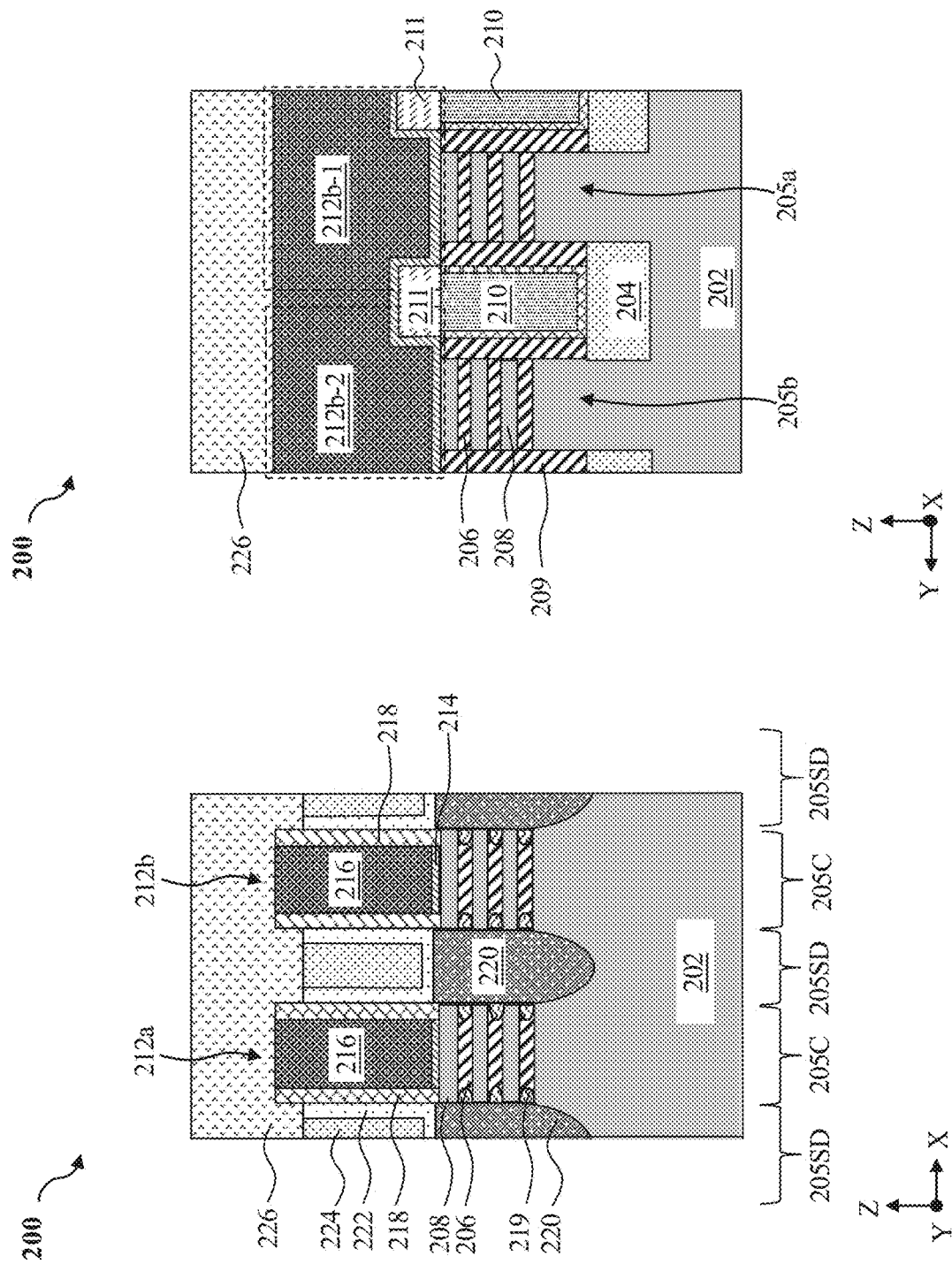

Referring to FIGS. 1, 4A, and 4B, method 100 includes a block 106 where the CESL 222 and the ILD layer 224 are partially recessed and a hard mask layer 226 is formed over the workpiece 200. A suitable etching process may be implemented to selectively remove the top portions of the CESL 222 and ILD layer 224 without substantially removing the dummy gate structures 212a-212b or the gate spacers 218. The hard mask layer 226 is then deposited over and between the dummy gate structures 212a-212b. The hard mask layer 226 may include aluminum oxide, silicon oxide, silicon nitride, silicon carbonitride, silicon oxycarbide, silicon oxynitride, silicon oxycarbonitride, other suitable materials, or combinations thereof, and may be formed by CVD, ALD, PVD, other suitable methods, or combinations thereof. In an embodiment, the hard mask layer 226 is formed to protect the ILD layer 224 from being damaged by some etching processes. A planarization process (e.g., one or more CMP processes) may be followed to planarize the hard mask layer 226 without exposing top surfaces of the dummy gate structures 212a-212b. That is, after the CMP processes, the hard mask layer 226 is disposed not only between two adjacent dummy gate structures 212a-212b but also over the top surfaces of the dummy gate structures 212a-212b.

Figures 5A, 5B:
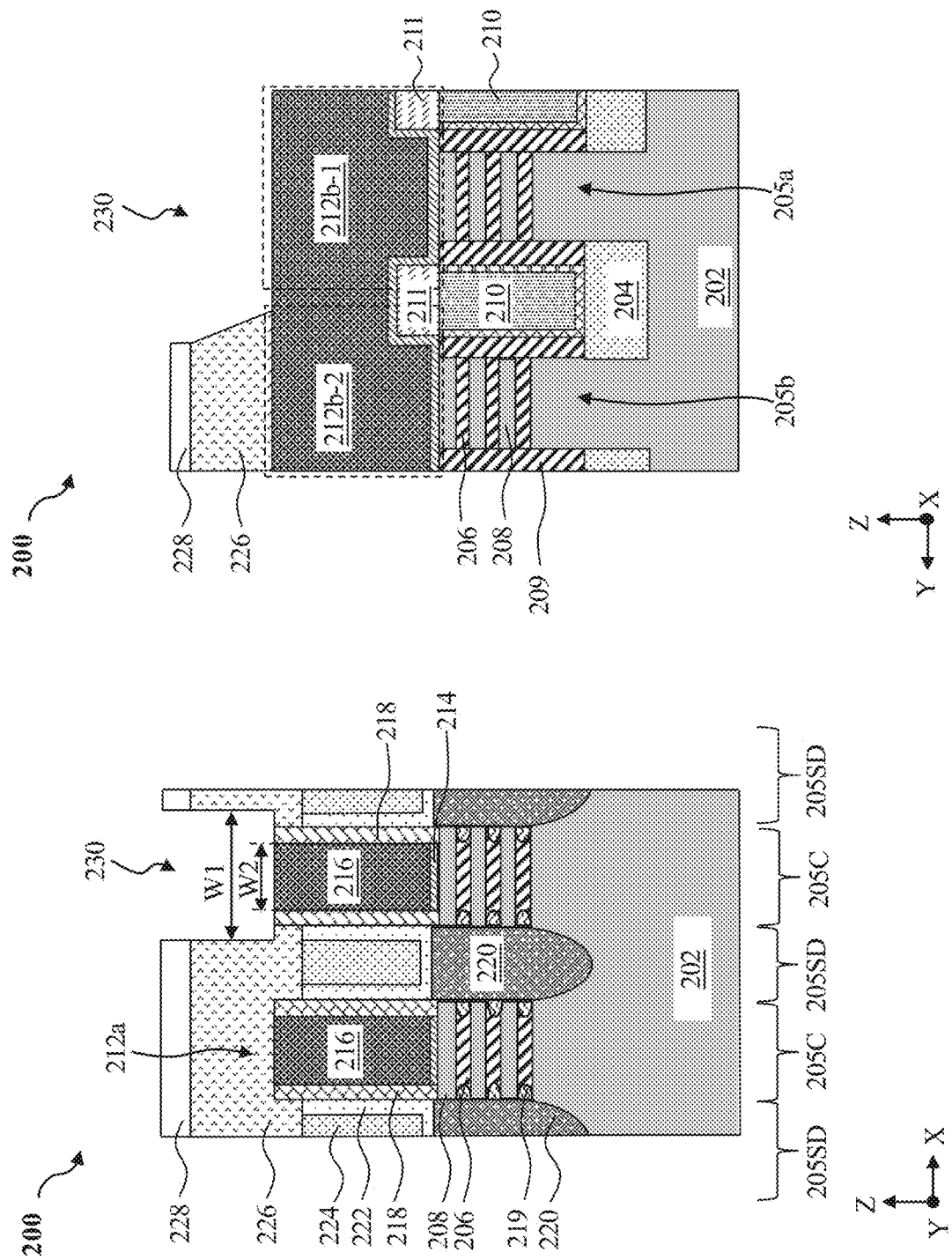

Referring to FIGS. 1, 5A, and 5B, method 100 includes a block 108 where the hard mask layer 226 is patterned to form an opening 230 exposing the first portion 212b-1 of the dummy gate structure 212b (may be also referred to as dummy gate structure 212b-1). The patterning of the hard mask layer 226 may include multiple processes. For example, a masking element 228 including a photoresist layer may be formed over the hard mask layer 226, exposed to a radiation source through a patterned mask, and subsequently developed to form a patterned masking element 228. The hard mask layer 226 may then be etched using the patterned masking element 228 as an etch mask to form the opening 230 exposing the dummy gate structure 212b-1 while not exposing the dummy gate structure 212a. In the present embodiment, the hard mask layer 226 also covers the second portion 212b-2 of the dummy gate structure 212b (may be referred to as dummy gate structure 212b-2). While not depicted herein, in some embodiments, the hard mask layer 226 may be patterned to expose the dummy gate structure 212b in its entirety along the Y direction. The dimension of the opening 230 along the Y axis corresponds to the dimension of the CPODE structure 245 (to be described below). In some embodiments, considering alignment overlay of the patterning, along the X direction, the opening 230 spans a width W1 that is greater than a width W2 of the dummy gate structure 212b.

Referring to FIGS. 1, 6A, and 6B, method 100 includes a block 110 where the dummy gate structure 212b-1 exposed by the opening 230 is removed to form a trench 232 between the gate spacers 218. An etching process 231 may be implemented to selectively remove the dummy gate electrode 216 of the dummy gate structure 212b-1 without substantially removing the dielectric layer 214, the gate spacers 218, or the hard mask layer 226. The etching process 231 may be a dry etching process, a wet etching process, an RIE process, or combinations thereof that implements a suitable etchant.

Figures 7A, 7B:
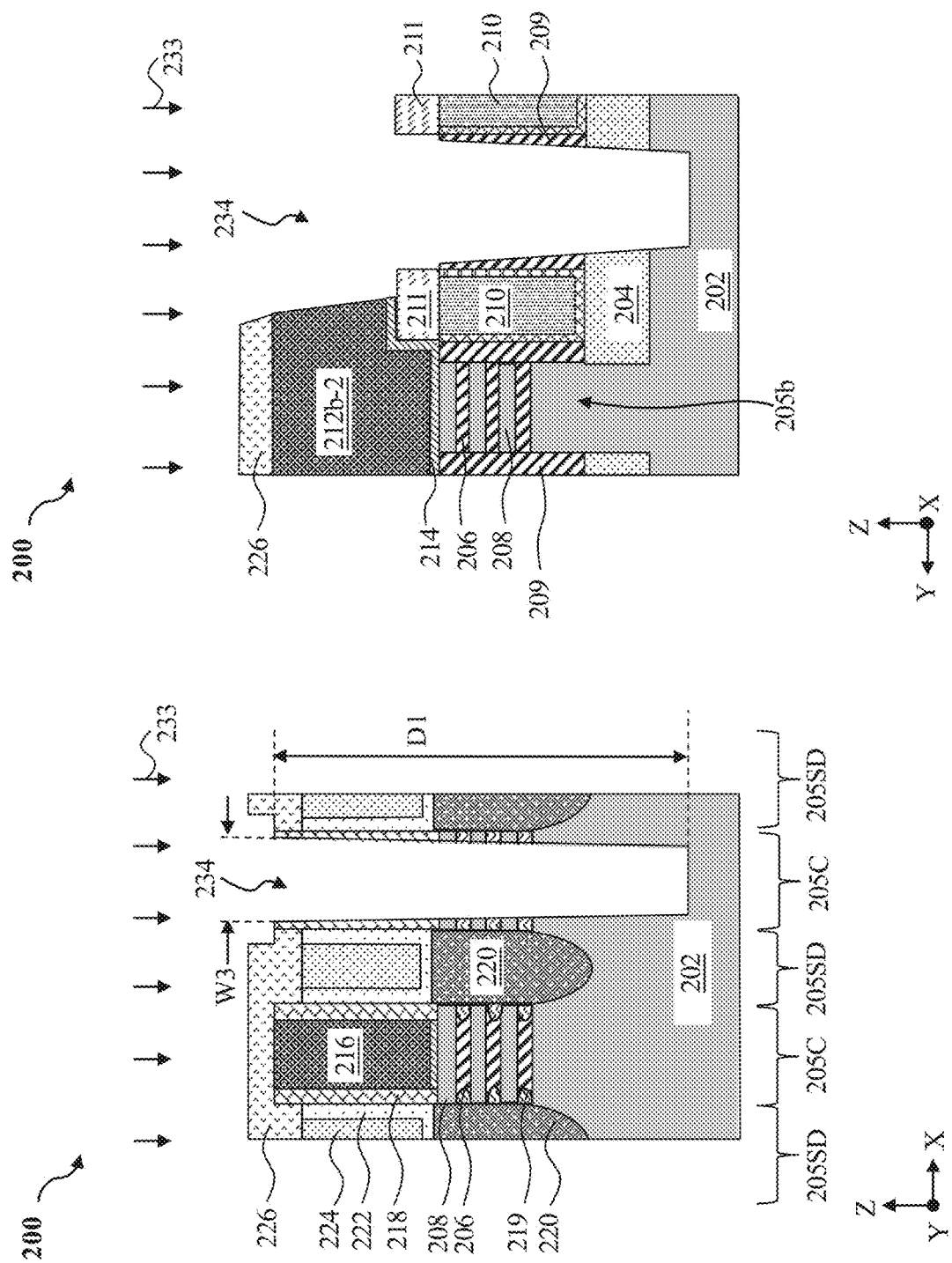
Figures 9A, 9B:
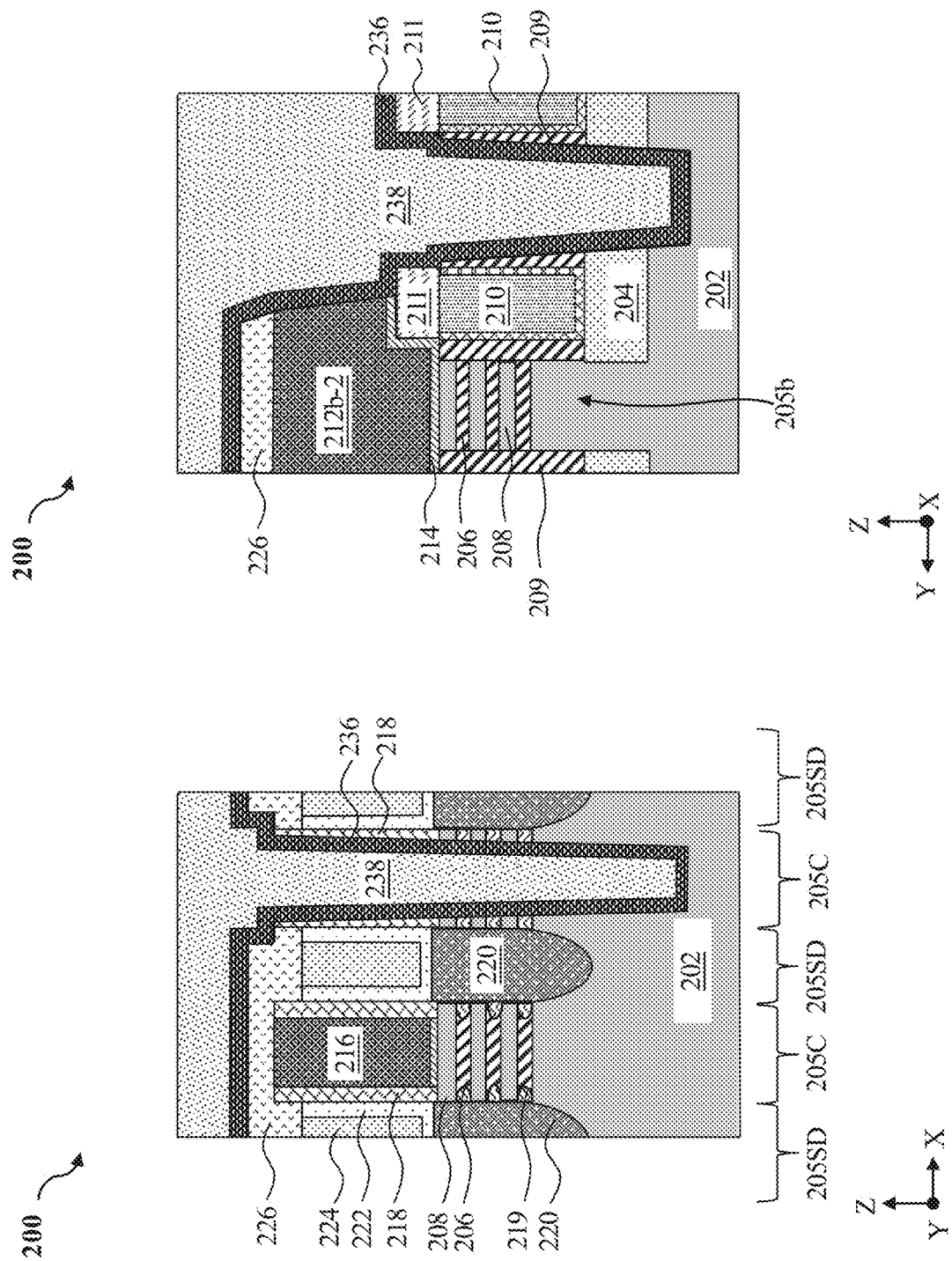

Referring to FIGS. 1, 7A, and 7B, method 100 includes a block 112 where a portion of dielectric layer 214 exposed by the trench 232, a portion of the channel region 205C and a portion of the substrate 202 directly under the trench 232 are removed. An etching process 233 implemented in block 112 extends the trench 232 vertically downward to expose the substrate 202. In embodiments represented in FIG. 7A, the etching process 233 also slightly etches the hard mask layer 226 without exposing the top surfaces of the dummy gate structures 212a or 212b-2. In some embodiments, the etching process 233 is different from the etching process 231. For example, these two etching processes implement different etchants. In some embodiments, the etching process 233 is a dry etching process, a wet etching process, an RIE process, or combinations thereof. In the present embodiments, after performing the operations in block 112, a trench 234 extending from the hard mask layer 226 to the substrate 202 is formed. Since the trench 234 is formed by extending the trench 232, the trench 234 may also be referred to as extended trench 232. In an embodiment, the trench 234 extends to below a bottom surface of the bottommost sacrificial layer 206. In embodiments represented in FIG. 7A, the trench 234 extends vertically beyond a bottom surface of the epitaxial source/drain features 220 and beyond a bottom surface of the STI feature 204 and has a depth D1. In an embodiment, considering existing semiconductor fabrication processes, D1 is between about 500 nm and about 2000 nm to form the air gap in the substrate 202. As shown in FIGS. 7A-7B, the trench 234 is a tapered trench, and the gate spacers 218 and the channel region 205C of the fin-shaped structure 205a are not fully removed such that the source/drain features 220 adjacent to the channel region 205C would not be substantially damaged in subsequent etching processes (e.g., the etching process 242 implemented to remove dummy liner 236). The trench 234 has a width W3 (shown in FIG. 7A) along the X direction. In an embodiment, W3 is between about 10 nm and about 50 nm to facilitate the formation of a satisfactory air gap while ensuring that the methods for forming the final structure of the workpiece 200 may be readily integrated into existing semiconductor fabrication processes.

Referring to FIGS. 1, 8A, and 8B, method 100 includes a block 114 where a dummy liner 236 is formed on the sidewall and bottom surface of the trench 234 and the workpiece 200. In an embodiment, the dummy liner 236 is conformally deposited to have a generally uniform thickness T1 over the top surface of the workpiece 200 (e.g., having substantially the same thickness on top surfaces and sidewall surfaces of the hard mask layer 226 and the trench 234) and partially fills the trench 234. The dummy liner 236 may be formed by performing a deposition process such as a CVD process, a PVD process, an ALD process, or other suitable deposition process. The dummy liner 236 is a placeholder layer and would be removed to form an air gap. In the present embodiments, the dummy liner 236 is selected to have a composition different from that of the hard mask layer 226 and a dielectric filler 238 (to be described below with reference to FIG. 9) subsequently formed in the trench 234 to ensure that the dummy liner 236 possesses etch selectivity with respect to these material layers. In some embodiments, the dummy liner 236 may include silicon nitride, silicon oxycarbonitride, silicon carbonitride, silicon oxynitride, other suitable materials, or combinations thereof. In some embodiments, the dummy liner 236 may include a nitrogen-containing dielectric material with a dielectric constant greater than that of the dielectric filler 238. In an embodiment, the dummy liner 236 includes aluminum oxide or other metal oxide, the hard mask layer 226 includes silicon nitride, and the dielectric filler 238 includes silicon oxide.

In an embodiment, a ratio between the thickness T1 of the dummy liner 236 to the width W3 of the trench 234 (i.e., T1/W3) may be between about 0.05 and about 0.45 such that a satisfactory air gap (e.g., formed in the bottom of the trench 234) may be formed to efficiently reduce the parasitic capacitance. In some implementations, given the width W3 of the trench, T1 is between about 0.5 nm and about 20 nm to form the satisfactory air gap.

Referring to FIGS. 1, 9A, 9B, 10A, and 10B, method 100 includes a block 116 where a dielectric filler 238 is formed on the dummy liner 236 to fill the trench 234. In the present embodiments, as described above, the dielectric filler 238 is configured to have a composition different from that of the dummy liner 236, such that the dummy liner 236 may be selectively removed in a subsequent process. In addition, to reduce the parasitic capacitance of the final structure of the workpiece 200, the dielectric filler 238 may be formed of a low-k material. For example, the dielectric filler 238 may include silicon oxide, TEOS, doped silicon oxide (e.g., BPSG, FSG, PSG, BSG, etc.), or other suitable materials, and may be formed by any suitable method, including CVD, FCVD, ALD, PVD, other methods, or combinations thereof.

As shown in FIGS. 10A and 10B, a planarization process (e.g., CMP) is then performed to remove excess materials to expose a top surface of a portion of the dummy liner 236 that extends vertically along the sidewall surface of the trench 234 to facilitate the removal of the dummy liner 236. In the present embodiment, the planarization process stops when top surfaces of the dummy gate structures 212a and 212b-2 are exposed. The planarized hard mask layer 226 may be referred to as hard mask layer 226'. After the planarization process, a top surface of the dielectric filler 238 is coplanar with top surfaces of the hard mask layer 226' and the dummy gate structures 212a and 212b-2. The top surface of the dielectric filler 238 formed in the trench 234 spans a width W4 (shown in FIG. 10A) along the X direction. In an embodiment, a ratio of the width W4 to the thickness T1 of the dummy liner 236 (i.e., W4/T1) may be between 0.5 and 20 to facilitate the formation of the satisfactory air gap. For example, if W4/T1 is greater than 20, the volume of the dummy liner 236 to be replaced by air gap 240 (shown in FIG. 24) would be too small to significantly reduce the parasitic capacitance. If the W4/T1 is less than 0.5, then the gap 240 formed by removing the dummy liner 236 would be too large that the seal material would undesirably fill a bottom portion of that gap, which may not be able to efficiently reduce the parasitic capacitance near the substrate 202.

Figures 11A, 11B:
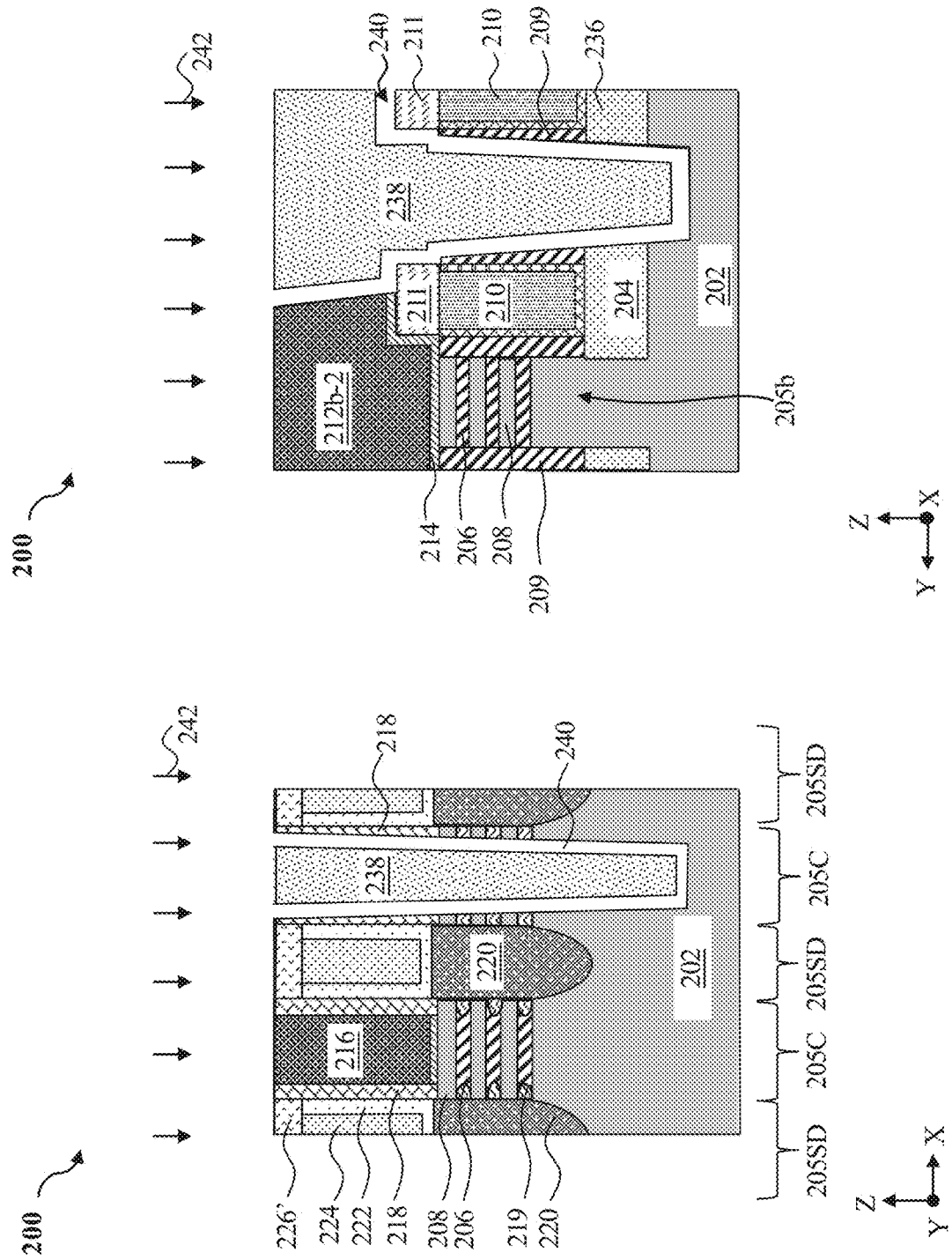

Referring to FIGS. 1, 11A, and 11B, method 100 includes a block 118 where the dummy liner 236 is selectively removed to form a gap 240. An etching process 242 is performed to selectively remove the dummy liner 236 without substantially removing the gate spacers 218, the channel region 205C adjacent to the dummy liner 236, the dielectric filler 238, the dummy gate structures 212a and 212b-2, or other components of the workpiece 200. The gap 240 tracks the shape of the dummy liner 236. The etching process 242 may include a dry etching process, a wet etching process, other suitable processes, or combinations thereof. For example, the etching process 242 is a wet etching process that utilizes an acid such as phosphoric acid ($H_3PO_4$), other suitable acids, or combinations thereof. In another embodiment, the etching process 242 is a dry etching process utilizing a halogen-based etchant such as a fluorine-based etchant (e.g., $CF_4$, $SF_6$, $CH_2F_2$, $CHF_3$, $C_2F_6$, HF), or other suitable etchant.

Figures 12A, 12B:
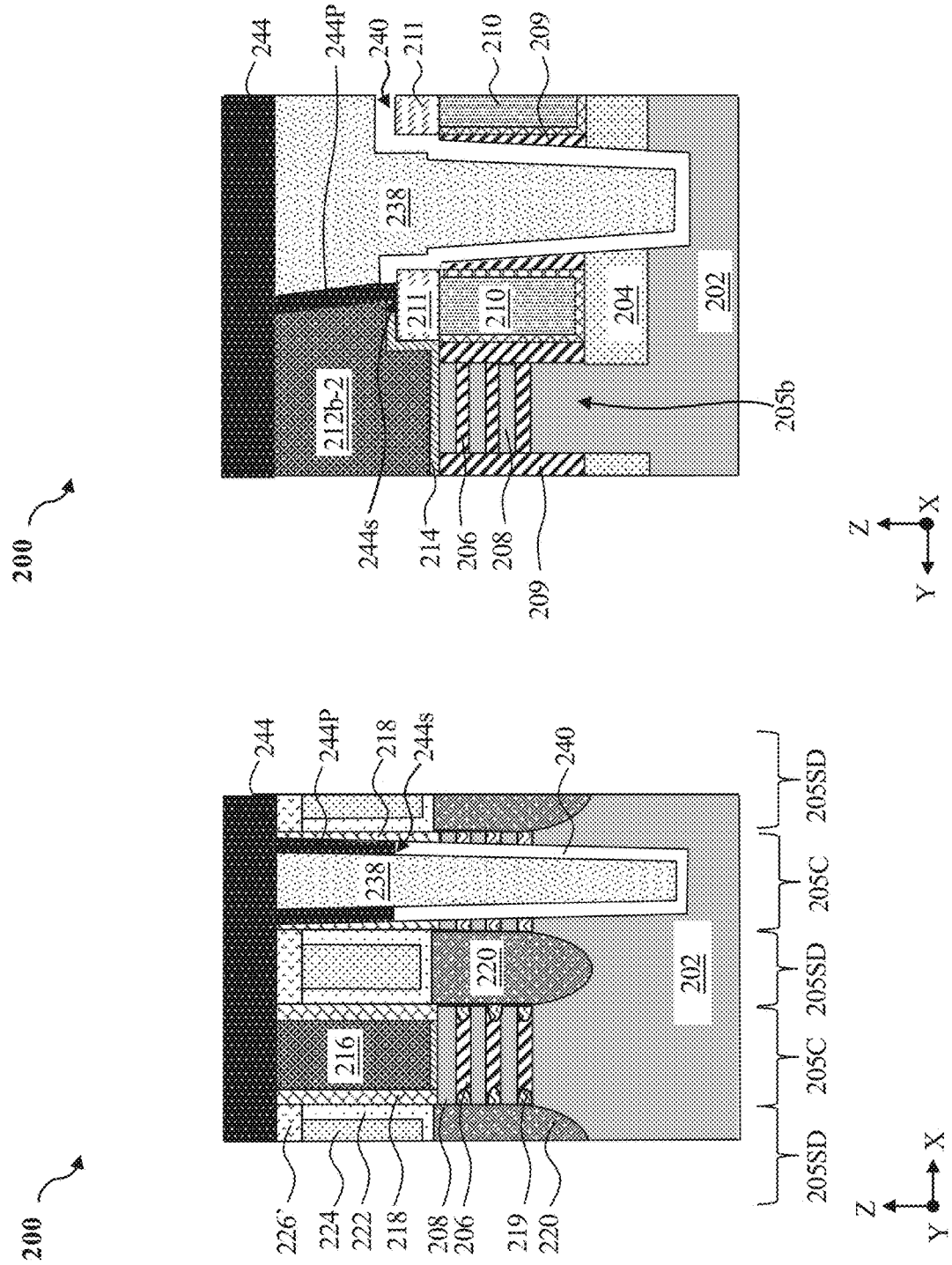
Figures 13A, 13B:
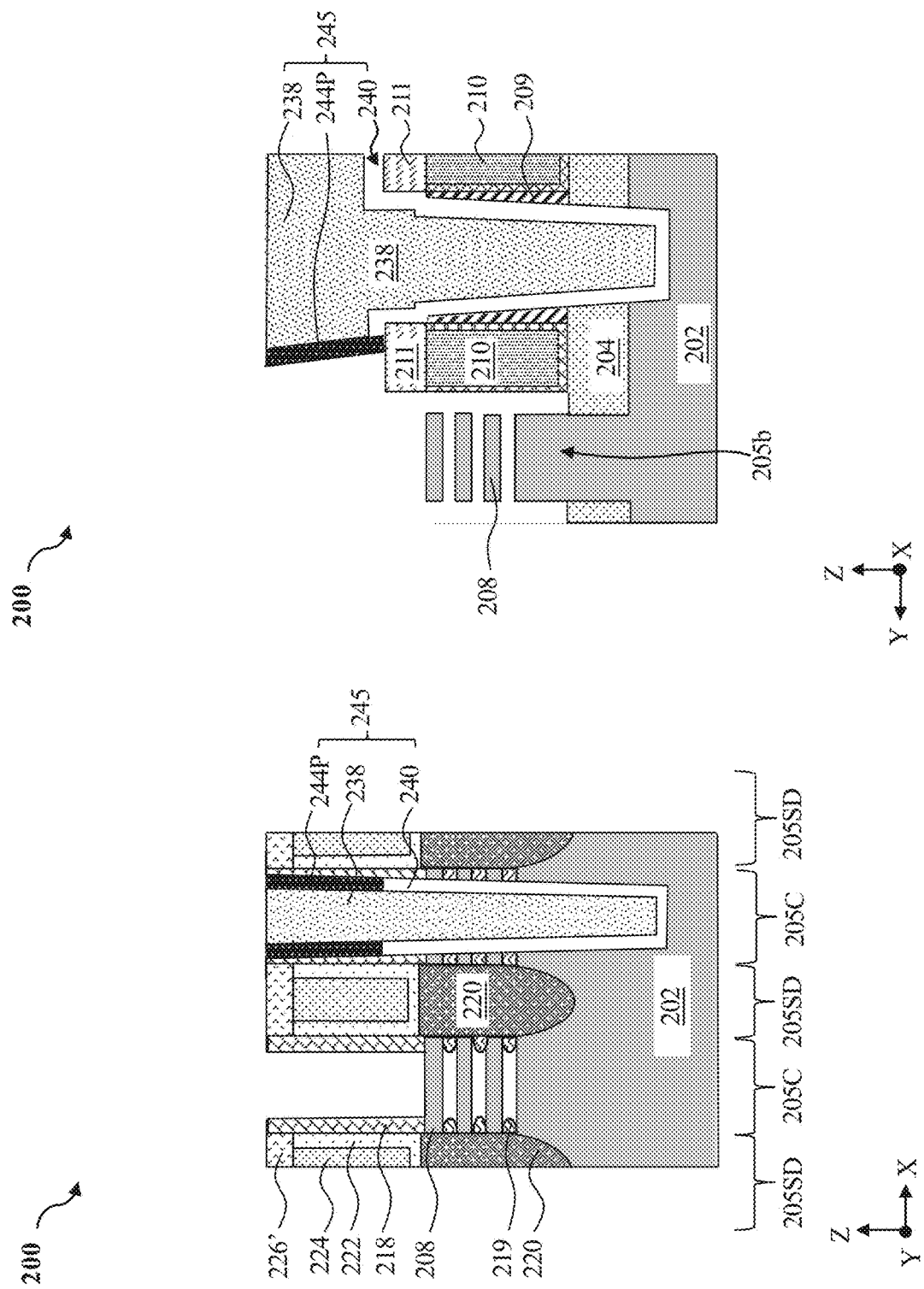

Referring to FIGS. 1, 12A-12B, and 13A-13B, method 100 includes a block 120 where a seal plug 244P is formed to seal the gap 240. After the formation of the gap 240, a seal material layer 244 may be deposited over the workpiece 200. After the deposition of the seal material layer 244, as shown in FIGS. 12A-12B, a portion (i.e., the seal plug 244P) of the seal material layer 244 partially fills the gap 240 to seal the gap 240 as an air gap 240. Although only one end of the gap 240 is shown to be sealed by the seal plug 244P in FIG. 12B, it is understood that the other end of the gap 240 is also sealed by another seal plug 244P formed from the seal material layer 244. As shown in FIGS. 13A and 13B, a planarization process may be followed to remove excess seal material layer 244 over the dummy gate electrode 216. The dielectric filler 238, the air gap 240, and the seal plug 244P may be collectively referred to as the CPODE structure 245 or the dielectric gate 245.

In this depicted example, a bottom surface 244s of the seal plug 244P is coplanar with a top surface of helmet layer 211 to provide the air gap 240 with a large volume to efficiently reduce the parasitic capacitance of the workpiece 200 while ensuring that the air gap 240 remains sealed in subsequent gate replacement process. Since the seal plug 244P is not extending beyond the top surface of the source/drain feature 220, the material of the seal plug 244P may be further selected such that an etch selectivity is provided between the ILD layer 224 and the seal plug 244P. More specifically, subsequent etching processes may etch the ILD layer 224 without substantially etching the seal plug 244P. The seal material layer 244 may include silicon nitride, silicon oxynitride, silicon carbonitride, and/or other suitable materials, and may be formed by using ALD, CVD, PVD, or other suitable methods.

Figures 14A, 14B:
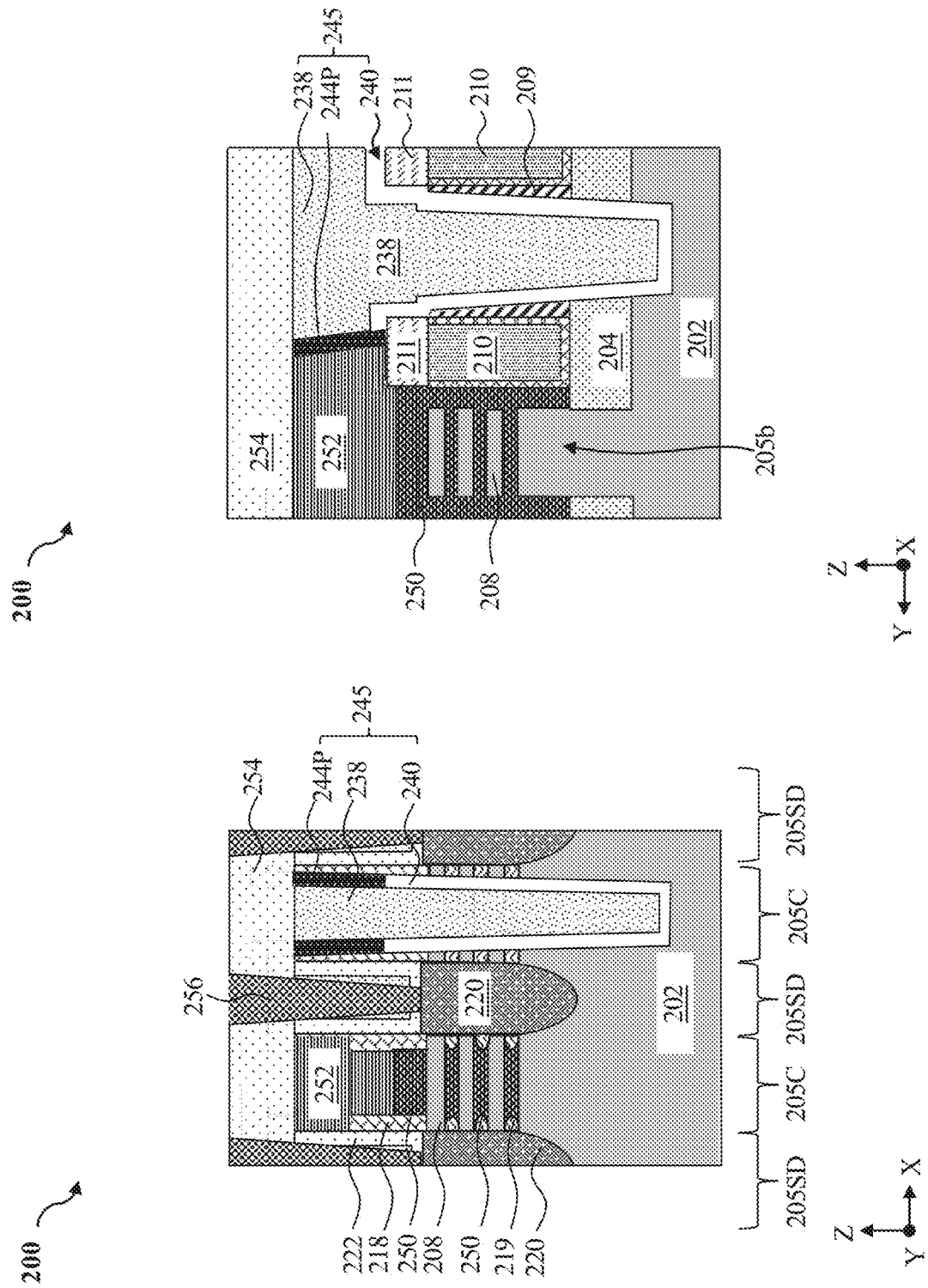

Referring to FIGS. 1, 13A-13B and 14A-14B, method 100 includes a block 122 where the dummy gate structures 212a and 212b-2 are replaced by a gate stack 250. As shown in FIGS. 13A-13B, the replacement includes performing an etching process to selectively remove the exposed dummy gate structures 212a and 212b-2 without substantially etching the seal material layer 244 or the dielectric filler 238. After the removal of the dummy gate structures, another etching process may be then performed to selectively remove the sacrificial layers 206 and the cladding layers 209 without substantially etching the channel layers 208 to release the channel layers 208 as channel members 208. As shown in FIGS. 14A-14B, after releasing the channel layers 208 as channel members 208, the gate stack 250 is formed over the workpiece 200 to wrap around and over each of the channel members 208. In the present embodiments, the gate stack 250 may include an interfacial layer (not explicitly shown), a gate dielectric layer (not explicitly shown) over the interfacial layer, and a gate electrode layer (not explicitly shown) over the gate dielectric layer. In some embodiments, the interfacial layer may include silicon oxide. The gate dielectric layer is then deposited over the interfacial layer using ALD, CVD, and/or other suitable methods. The gate dielectric layer may include high-K dielectric materials such as hafnium oxide, titanium oxide ($TiO_2$), hafnium zirconium oxide (HfZrO), tantalum oxide ($Ta_2O_5$), hafnium silicon oxide ($HfSiO_4$), zirconium oxide, zirconium silicon oxide ($ZrSiO_2$), lanthanum oxide ($La_2O_3$), aluminum oxide ($Al_2O_3$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), (Ba, Sr)$TiO_3$ (BST), silicon nitride (SiN), silicon oxynitride (SiON), combinations thereof, or other suitable material. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a planarization process, such as a CMP process, may be performed to remove excess materials over the ILD layer 224 to provide a substantially planar top surface of the gate stack 250 and facilitate the performing of further processes.

Referring to FIGS. 1, 14A, and 14B, method 100 includes a block 124 where further processes are performed. Such further processes may include recessing a top portion of the gate stack 250 and the gate spacers 218 and forming a self-aligned capping (SAC) dielectric layer 252 over the recessed gate stack 250 and the gate spacers 218. A planarization process may be followed to remove excess SAC dielectric layer 252 and remove the hard mask layer 226'. As shown in FIG. 14A, the dielectric filler 238 is spaced apart from the tapered gate spacers 218 by the seal plug 244P or the air gap 240. The dielectric filler 238 is also spaced apart from the channel members 208 and the inner spacer features 219 by the air gap 240. As shown in FIG. 14B, the dielectric filler 238 is spaced apart from the SAC dielectric layer 252 by the seal plug 244P and spaced apart from the helmet layer 211 by the air gap 240. The dielectric filler 238 is also spaced apart from the cladding layer 209, the STI feature 204, and the substrate by the air gap 240. In the present embodiments, the air gap 240 is configured to reduce the parasitic capacitance of the workpiece 200, thereby reducing the RC delay and improving the device performance.

Such further processes may also include forming a silicide layer (not depicted) over the source/drain features 220 and a multi-layer interconnect (MLI) structure (not depicted) over the workpiece 200. The MLI may include various interconnect features, such as vias and conductive lines, disposed in dielectric layers, such as etch-stop layers and ILD layers (such as ILD layer 224). In some embodiments, the vias are vertical interconnect features configured to interconnect device-level contacts, such as the source/drain contacts 256 formed over the source/drain features 220 and gate contacts (not depicted) formed over the gate stack 250.

Figures 15A, 15B:
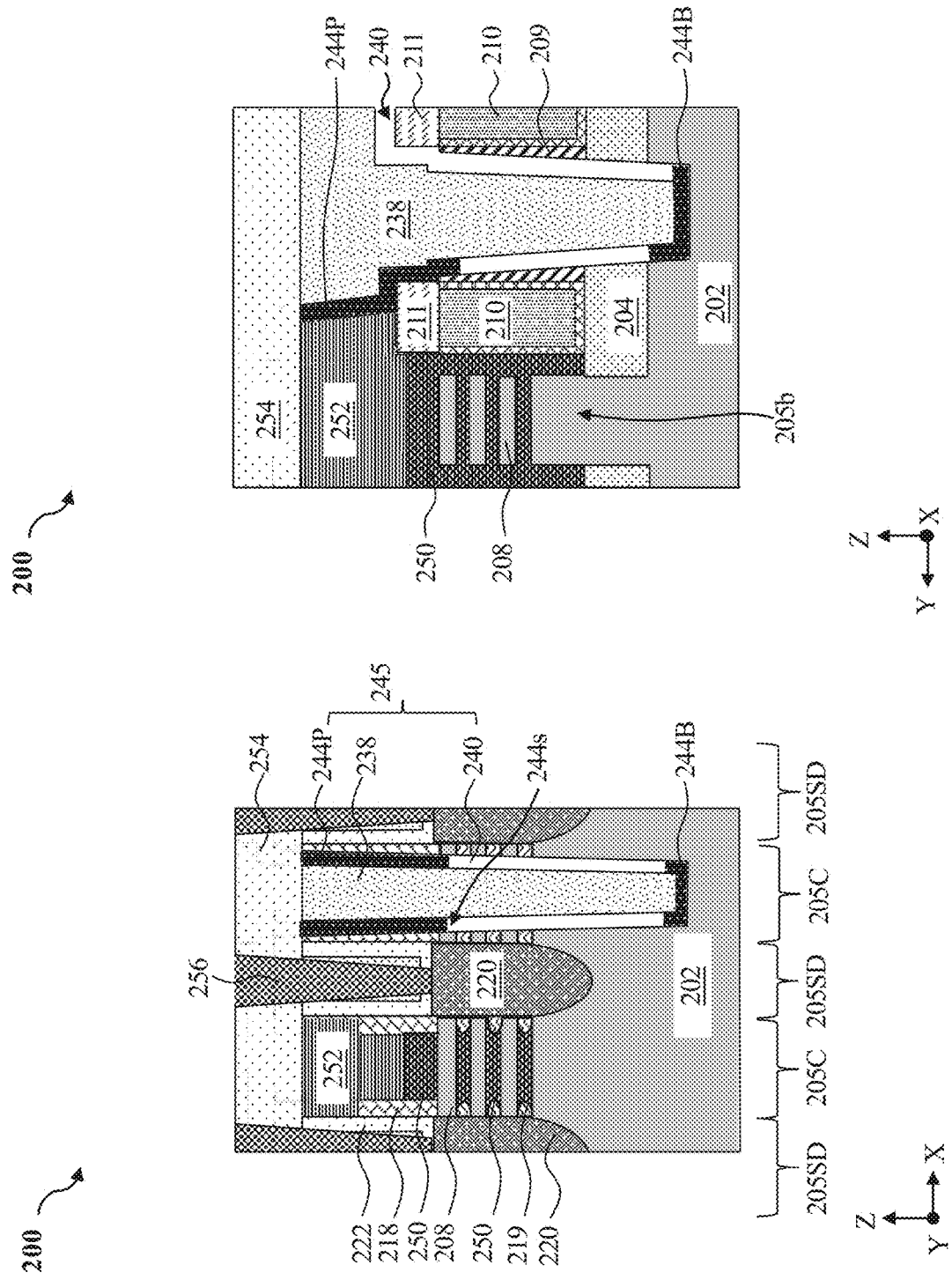

In some implementations, to further improve the reliability, as shown in FIGS. 15A-15B, the seal plug 244P may extend downward and beyond the top surface of source/drain feature 220 to ensure that the seal plug 244P is not fully removed during the formation of the source/drain contacts 256 even if there is an alignment overlay in the patterning. That is, the bottom surface 244s of the seal plug 244P may be lower than the top surface of the source/drain feature 220. In such situation, the gaseous precursors of the ALD process for forming the seal plug 244P may reach the bottom surface of the trench 234 and thus form a material layer 244B on the bottom surface of the trench 234. That is, in some situations, the reliability of the workpiece 200 may be improved by slightly sacrificing the volume of the air gap 240.

Figure 16:
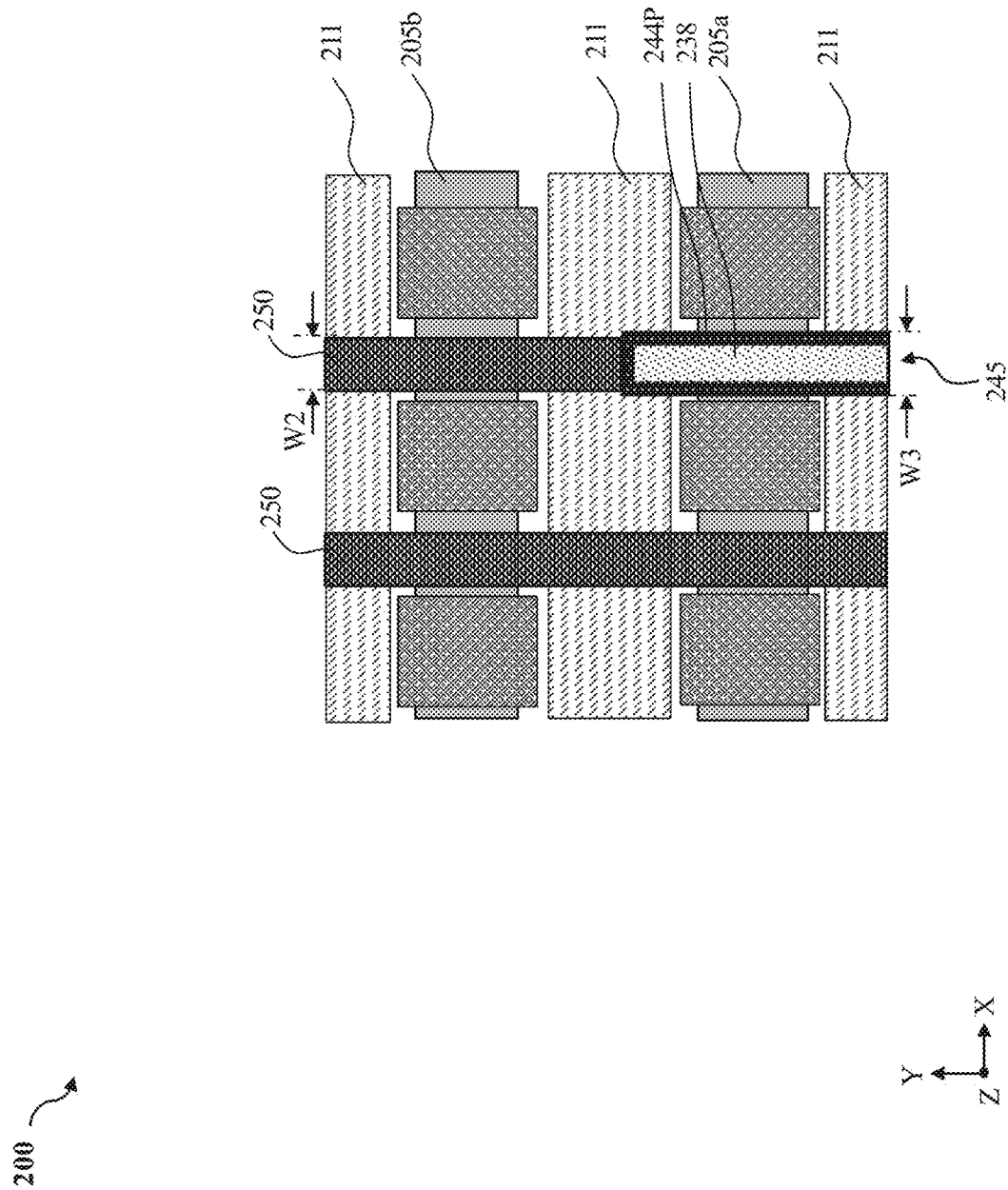
FIG. 16 illustrates a fragmentary top view of an exemplary semiconductor structure shown in FIGS. 15A-15B, according to various embodiments of the present disclosure.
Figure 17:
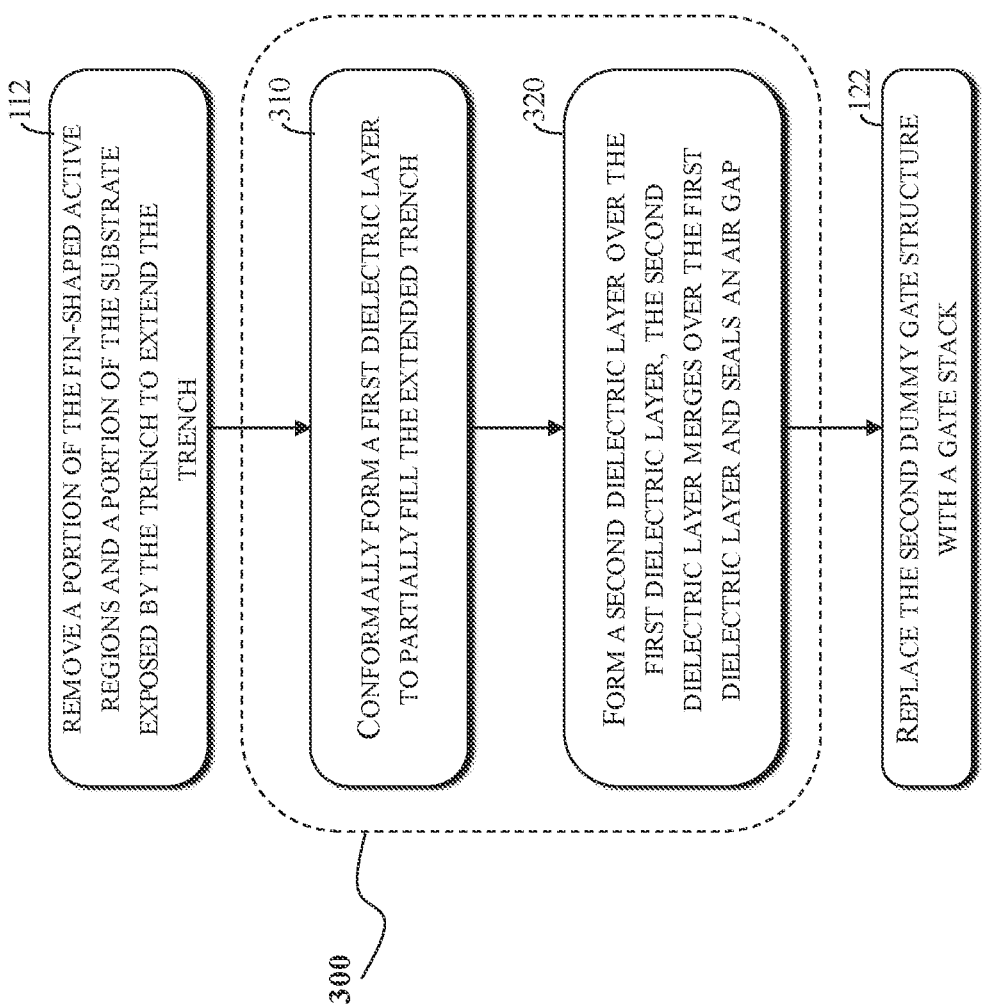
FIG. 17 illustrates a flowchart of an alternative method for forming an alternative isolation structure of the semiconductor device, according to various embodiments of the present disclosure.
Figures 18A, 18B:
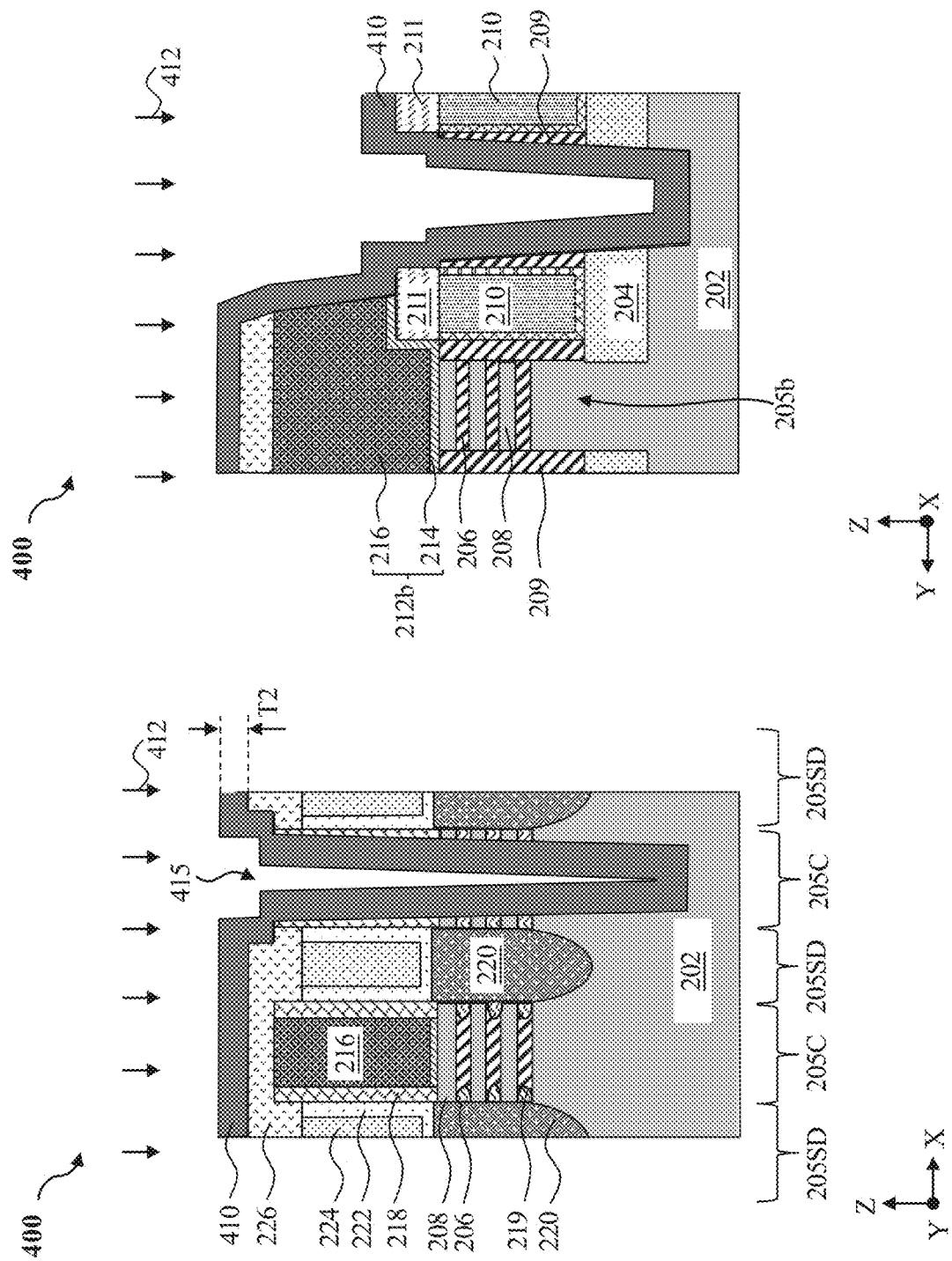

FIG. 16 depicts a fragmentary layout of the workpiece 200 shown in FIG. 14A and FIG. 15A. In the embodiments represented in FIG. 16, the width of the gate stack 250 may be substantially equal to the width W2 of the dummy gate structure 212b, the width of the CPODE structure 245 may be substantially equal to the width W3 of the trench 234 and is greater than W2. That is, the ratio of W3 to W2 (i.e., W3/W2) is greater than 1, due to the partially removed gate spacers 218. Although not explicitly shown in FIG. 16, it is understood that the air gap 240 is sealed by the seal plug 244P.

In embodiments described above, method 100 is implemented to form the CPODE structure 245 to reduce the parasitic capacitance of the semiconductor structure 200. FIG. 17 illustrates a flowchart of an alternative method 300 for forming an alternative CPODE structure 440 to reduce the parasitic capacitance of semiconductor structure 400, according to various embodiments of the present disclosure. More specifically, after performing the operations in block 112 in method 100, instead of performing operations in blocks 114, 116, 118, and 120 in method 100, method 300 is employed to form the alternative CPODE structure 440.

Referring to FIG. 1, FIG. 17, and FIGS. 18A-18B, after forming the trench 234 (shown in FIGS. 7A and 7B), method 300 includes a block 310 where a first dielectric layer 410 is formed on the trench 234 and the workpiece 400. In an embodiment, the first dielectric layer 410 is conformally deposited by performing a first deposition process 412 to have a generally uniform thickness T2 over the top surface of the workpiece 400 and partially fills the trench 234. That is, the first deposition process 412 forms the first dielectric layer 410 on sidewall and bottom surfaces of the trench 234. The partially filled trench 234 may be referred to as trench 415. The first deposition process 412 may include an ALD process or other suitable deposition process. Different from the dummy liner 236 that would be removed to form the air gap 240, the first dielectric layer 410 would not be removed. Therefore, to provide a reduced parasitic capacitance for the final structure of the workpiece 400, the first dielectric layer 410 is formed of a low-k material and may include TEOS, silicon oxide, doped silicon oxide (e.g., BPSG, FSG, PSG, BSG, etc.), other suitable materials, or combinations thereof.

In an embodiment, a ratio between the thickness T2 of the first dielectric layer 410 to the width W3 of the trench 234 (i.e., T2/W3) may be between about 0.1 and about 0.3 to provide the dimension-reduced trench 415 (relative to the trench 234) while ensuring a to-be-formed second dielectric layer 420 would merge over the first dielectric layer 410 to form a satisfactory air gap 430 (shown in FIG. 19A) to efficiently reduce the parasitic capacitance. If the ratio T2/W3 is greater than 0.3, the to-be-formed air gap 430 may have a small volume that would not significantly reduce the parasitic capacitance. If the ratio T2/W3 is less than 0.1, the to-be-formed second dielectric layer 420 may not merge over the first dielectric layer without significantly fill the trench 415. In an embodiment, given the width W3 of the trench, T2 is between about 1 nm and 15 nm to form the satisfactory air gap 430.

Referring to FIG. 1, FIG. 17, FIGS. 19A-19B, and FIGS. 20A-20B, method 300 includes a block 320 where a second dielectric layer 420 is formed on the first dielectric layer 410 and the workpiece 400. The second dielectric layer 420 may be formed by performing a second deposition process 418 such as a PVD process, a CVD process, other suitable processes, or combinations thereof. The second deposition process 418 forms the second dielectric layer 420 over the trench 415 and over the first dielectric layer 410, and upon merging across the top opening of the trench 415, seals an air gap 430 (which is a lower portion of the trench 415) between the first dielectric layer 410 and under the second dielectric layer 420. The second deposition process 418 is different from the first deposition process 412. In an embodiment, the first deposition process 412 includes ALD, and the second deposition process 418 includes CVD. As a result, a bottom portion of the thus-formed second dielectric layer 420 includes a concave bottom surface that curves downward, as shown in FIG. 19B. In this depicted example, the air gap 430 is disposed in the substrate 202 and in the channel region 205C. A ratio of a width of a top surface of the second dielectric layer 420 to the width W3 of the trench 234 may be between about 0.4 and about 0.8 such that the second dielectric layer 420 merges over the first dielectric layer 410. In an embodiment, a ratio of a width of the top surface of the second dielectric layer 420 to the width W3 is between about 0.45 and about 0.65 to further improve the device performance.

The second dielectric layer 420 may include any suitable material, such as silicon nitride, silicon oxycarbonitride, silicon carbonitride, silicon oxycarbide, silicon, a low-k dielectric material, TEOS, silicon oxide, doped silicon oxide (e.g., BPSG, FSG, PSG, BSG, etc.), other suitable materials, or combinations thereof. In an embodiment, the second dielectric layer 420 is formed of a low-k dielectric material to help reduce the parasitic capacitance. In some embodiments, the composition of the second dielectric layer 420 is different from a composition of the first dielectric layer 410. For example, the first dielectric layer 410 may include silicon oxide, and the second dielectric layer 420 may include TEOS. In other alternative embodiments, the first dielectric layer 410 and the second dielectric layer 420 may have a same composition such as silicon oxide. The first dielectric layer 410, the second dielectric layer 420, and the air gap 430 may be collectively referred to as an CPODE structure 440 or a dielectric gate 440. In the present embodiments, because air has a k value of 1, and both the first dielectric layer 410 and the second dielectric layer 420 are formed of low-k dielectric material(s), the capacitance associated with the CPODE structure 440 is advantageously reduced.

Figures 20A, 20B:
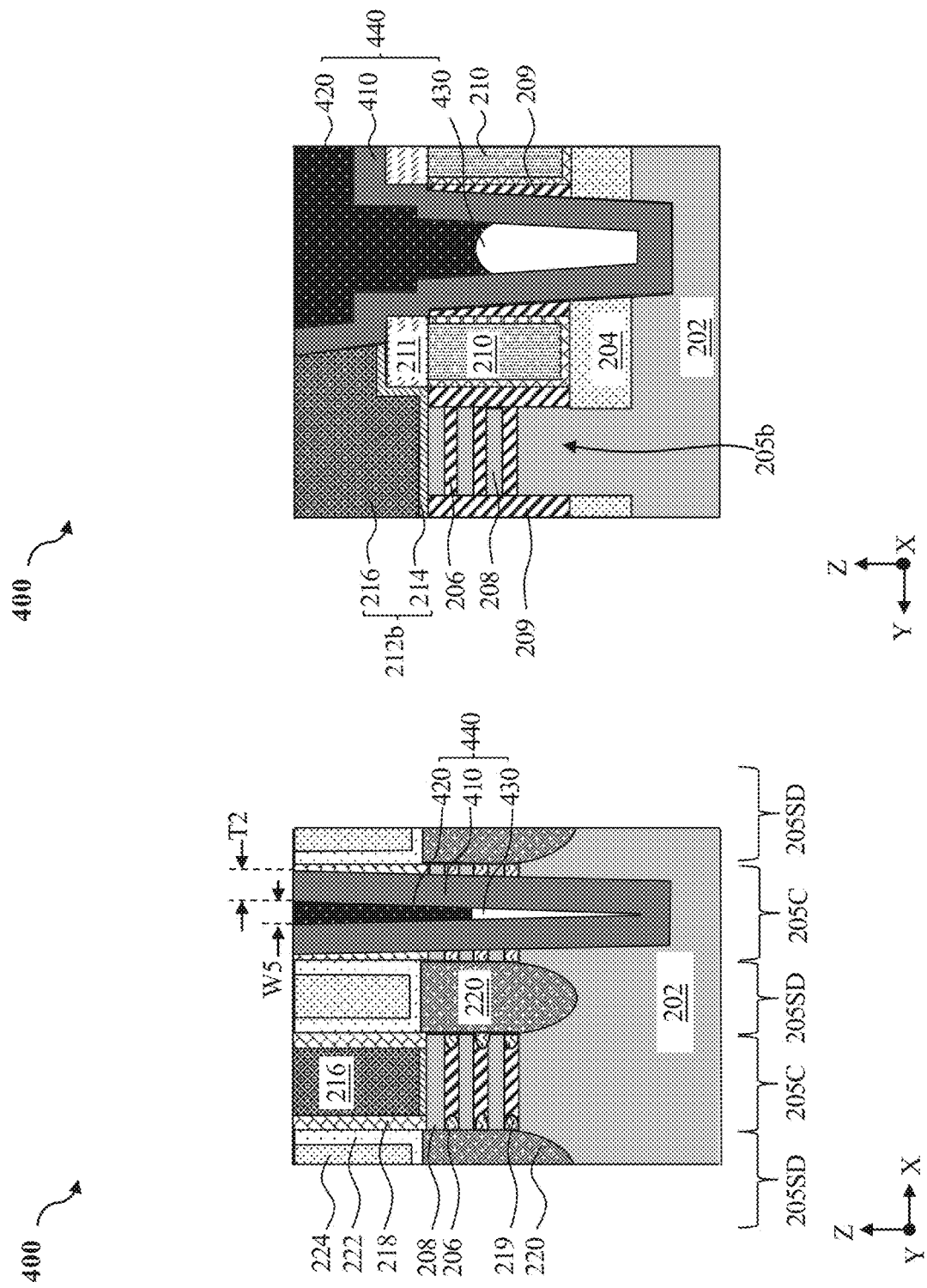

Subsequently, as shown in FIGS. 20A-20B, a planarization process (e.g., CMP) is performed to remove excess materials over the ILD layer 224, define a final structure of the CPODE structure 440, and provide a planar top surface. A top surface of the second dielectric layer 420 has a width W5 (shown in FIG. 20A) along the X direction. In an embodiment, a ratio of the width W5 to the thickness T2 of the first dielectric layer 410 (i.e., W5/T2) may be between 1.5 and about 4 to facilitate the formation of the satisfactory air gap 430.

Referring to FIGS. 1, 17, and 21A-21B, operations described in blocks 122 and 124 are applied to workpiece 400, and detailed description of those operations are omitted below for reason of simplicity. The ILD layer 254 and the source/drain contacts 256 are omitted in FIGS. 21A-21B for reason of simplicity. Different from the workpiece 200 in FIGS. 14A-14B, the air gap 430 in workpiece 400 is spaced apart from other components of the semiconductor structure 400 by either the first dielectric layer 410 or the second dielectric layer 420. For example, the air gap 430 is spaced apart from the substrate 202, the channel members 208, the partially etched cladding layer 209, and the STI feature 204 by the first dielectric layer 410. It is noted that, the location of the air gap 430 is related to the deposition thickness T2, and the deposition processes 412 and 418. Other deposition thickness T2 and deposition processes may change the location of the air gap 430 and may not be able to significantly reduce the parasitic capacitance of the workpiece 400.

In some embodiments, to increase the volume of the air gap 430 to further reduce the parasitic capacitance of the workpiece 400, after following the operations in method 100 to form the trench 234 as shown in FIG. 7A, another etching process may be performed to enlarge the bottom portion of the trench 234 in the substrate 202 without substantially etching the source/drain features 220. The etching process may include an isotropic etching process. After enlarging the bottom portion of the trench 234, method 300 may be then followed to form the workpiece 400' shown in FIGS. 22A and 22B. As shown in FIG. 22A, different from the CPODE structure 440 that has a tapered shaped shown in FIG. 21A, a cross-sectional review of the CPODE structure 440' resembles a spoon shape and includes an upper handle portion similar to the upper portion of the CPODE structure 440, and an enlarged bottom portion. The air gap 430' also resembles a spoon shape and includes an enlarged bottom portion, compared to the air gap 430. By providing the air gap 430' with the enlarged the bottom portion, the parasitic capacitance of the workpiece 400' is further reduced compared to that of the workpiece 400.

Figures 21A, 21B:
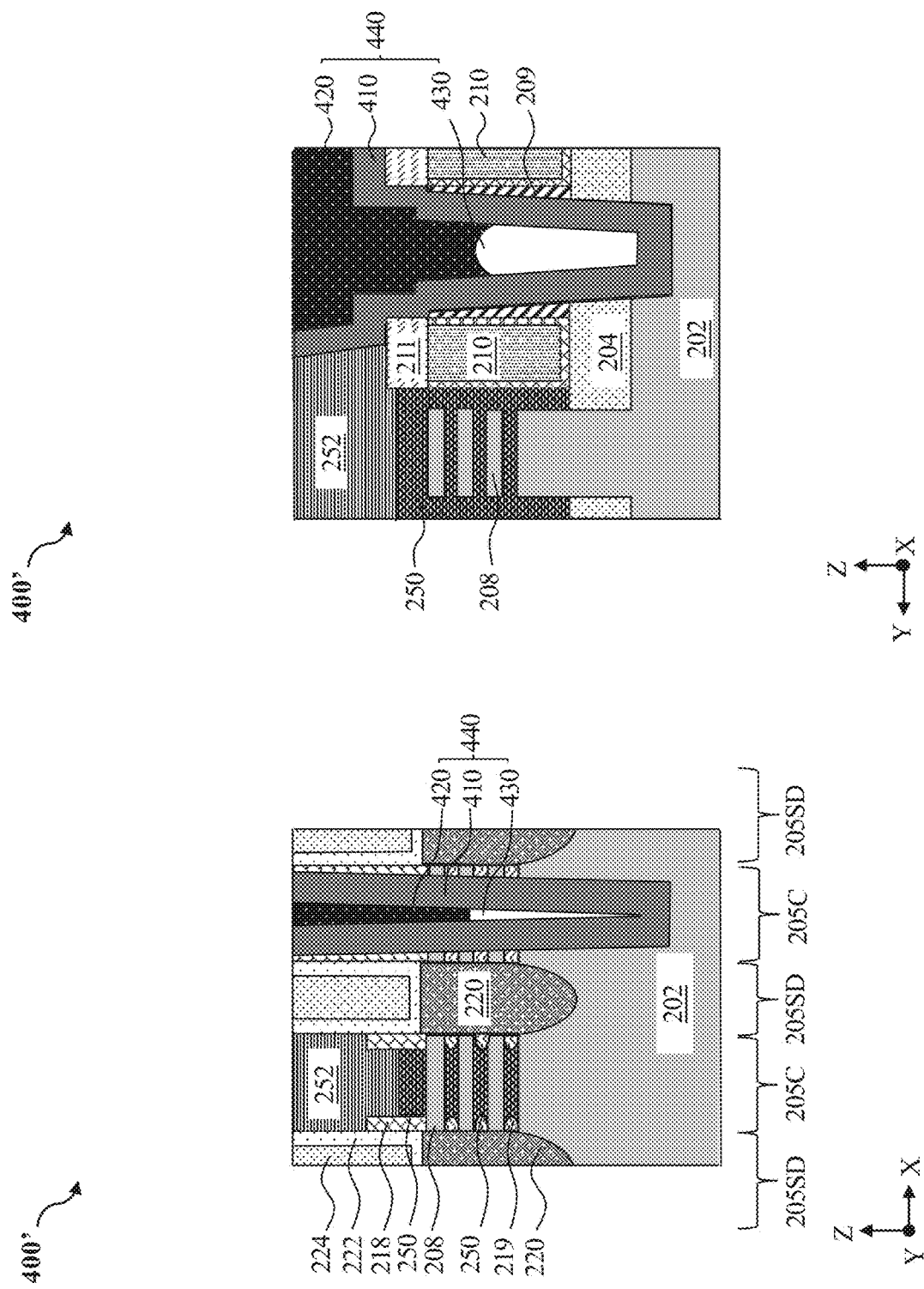
Figures 22A, 22B:
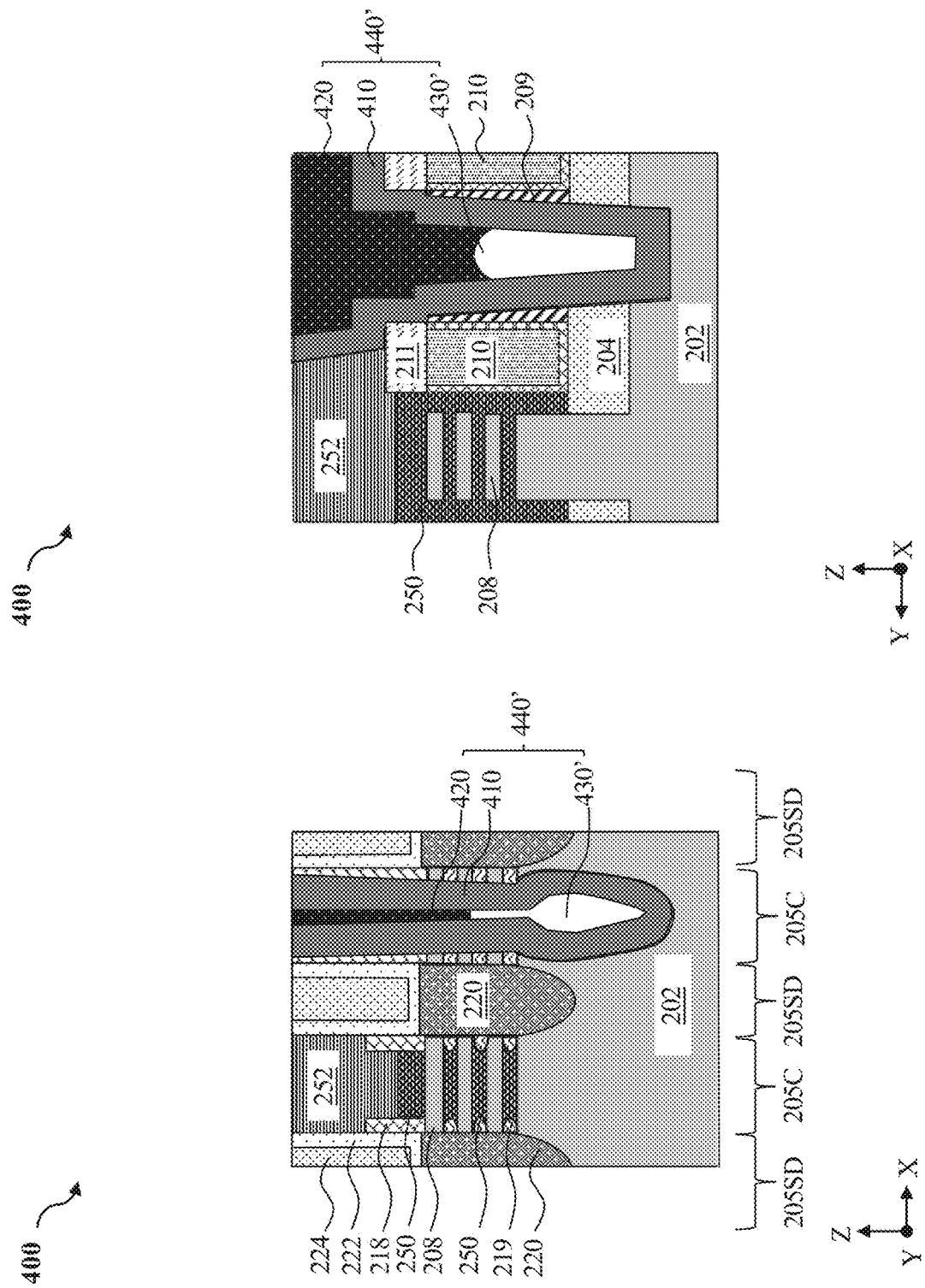
Figure 23:
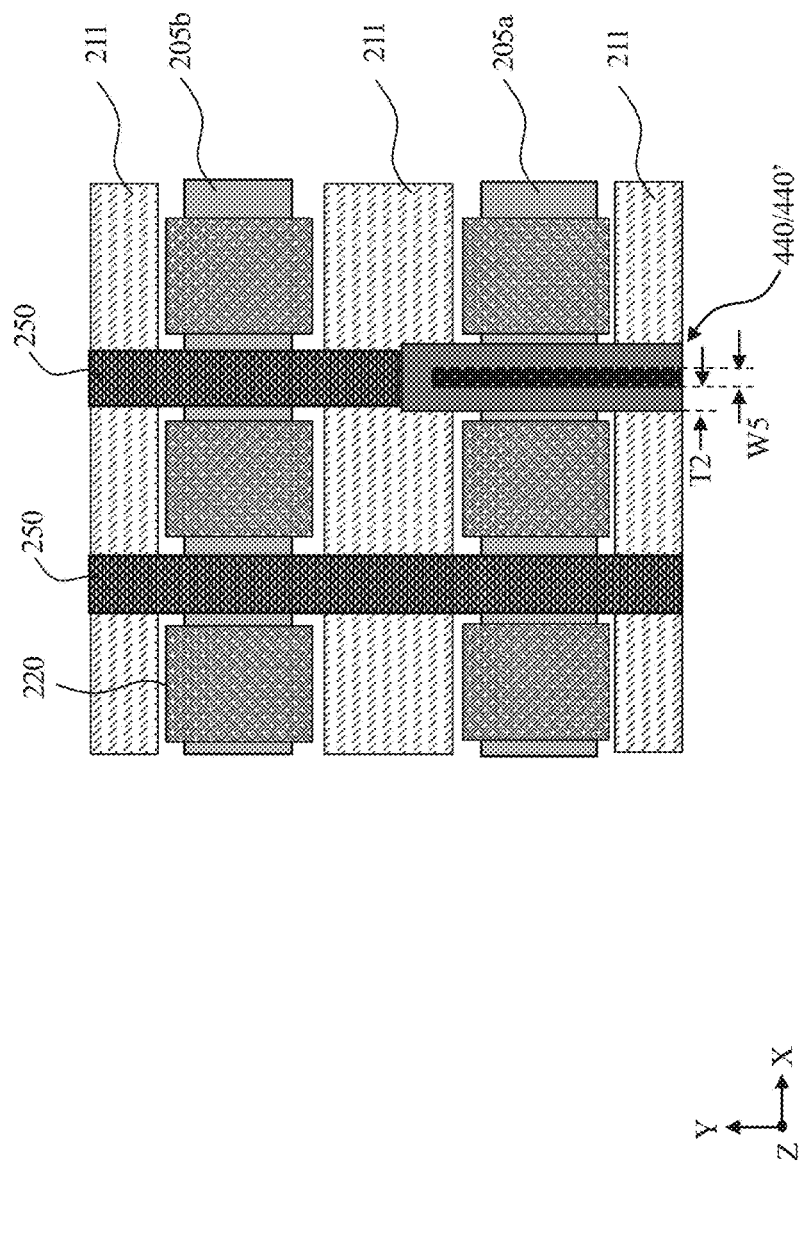
FIG. 23 illustrates a fragmentary top view of an alternative exemplary semiconductor structure shown in FIGS. 22A-22B, according to various embodiments of the present disclosure.
Figure 24:
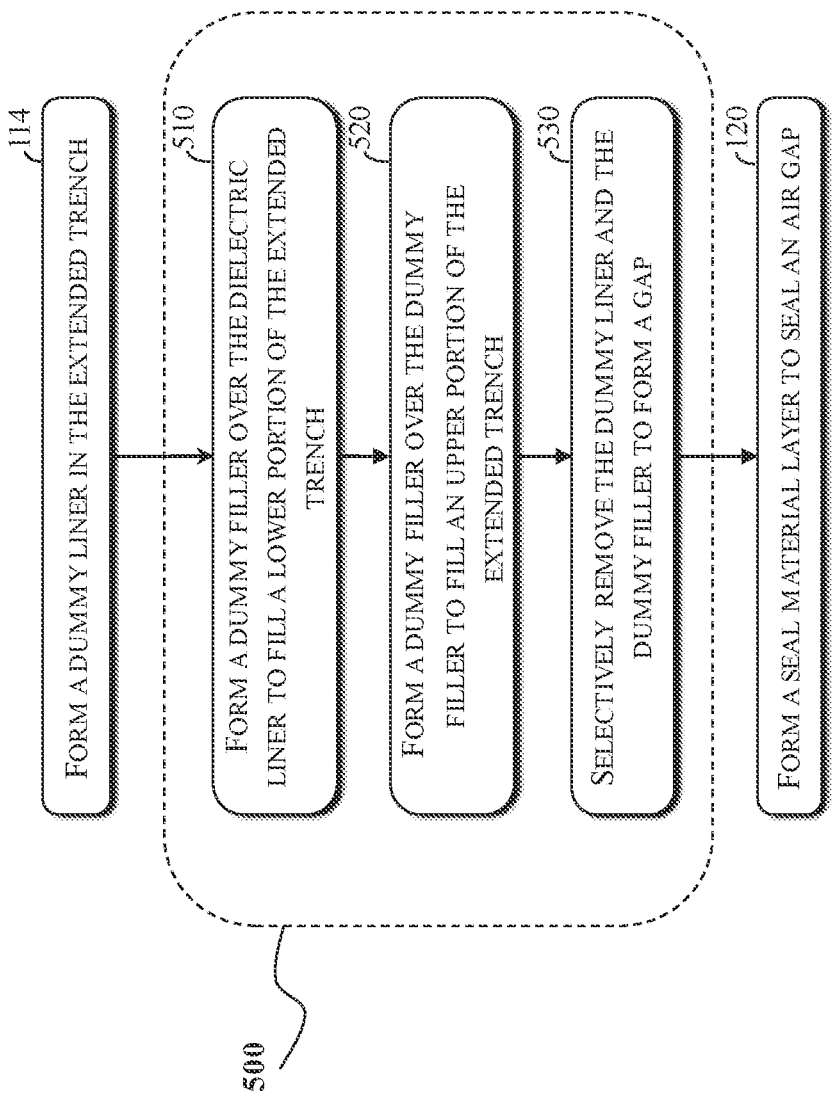
FIG. 24 illustrates a flowchart of another alternative method for forming another alternative isolation structure of the semiconductor device, according to various embodiments of the present disclosure.
Figures 25A, 25B:
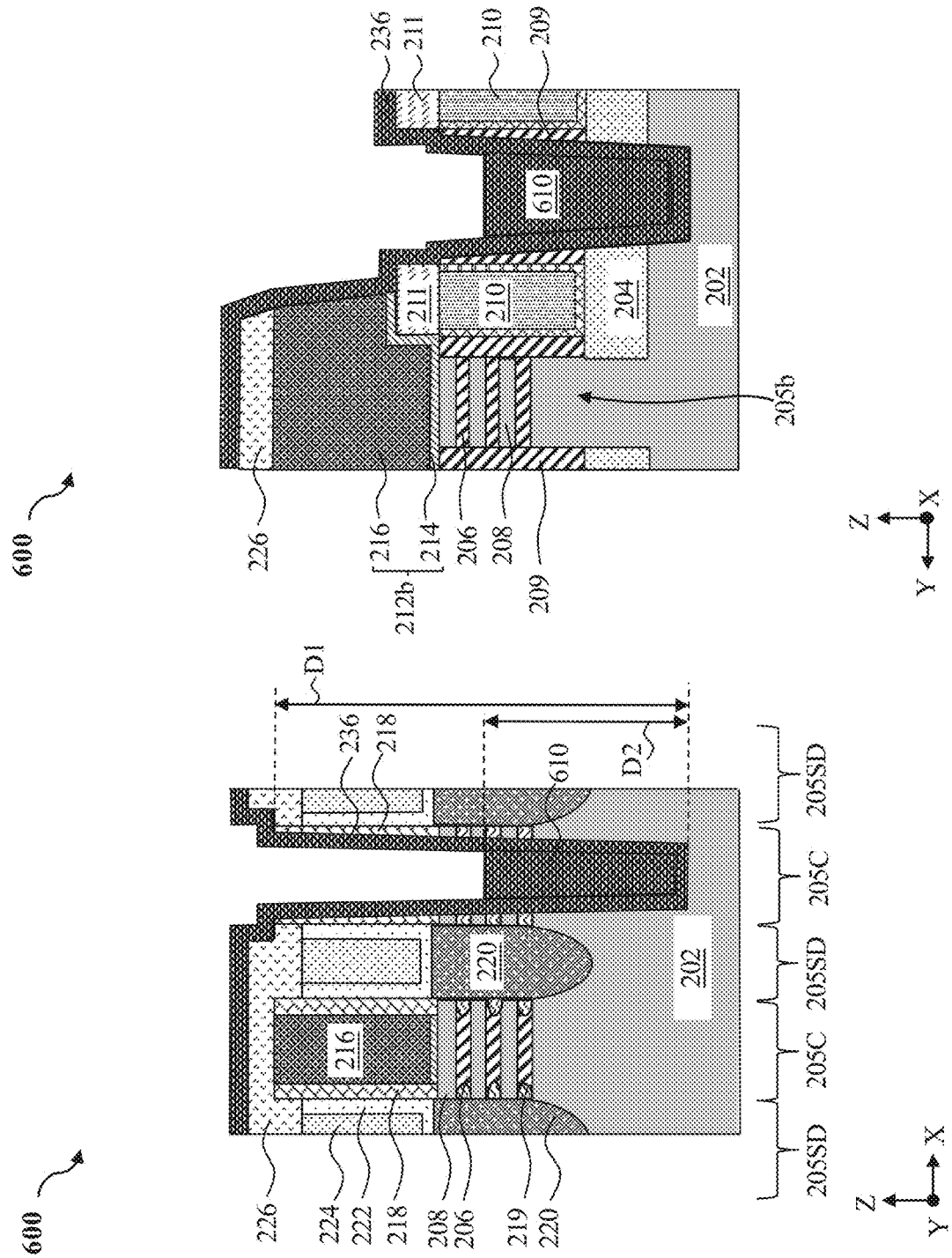

FIG. 23 illustrates a fragmentary top view of the workpiece 400/400' shown in FIGS. 21A/22A, according to various embodiments of the present disclosure. In embodiments represent in FIGS. 16 and 23, although only the dummy gate structure 212b-1 is replaced by the CPODE structure 245/440/440', the present embodiments do not limit the length of the CPODE structure 245/440/440' along the Y axis. In other words, the CPODE structure 245/440/440' may be configured to replace the entire or portions of the dummy gate structure 212b disposed over the one or more fin-shaped structures such as the fin-shaped structures 205a-205b, while the rest of the dummy gate structure 212b (e.g., dummy gate structure 212b-2) is replaced with the gate stack 250.

FIG. 24 illustrates a flowchart of another alternative method 500 for forming an alternative CPODE structure 650 in workpiece 600 to further reduce the parasitic capacitance, according to various embodiments of the present disclosure. More specifically, after performing the operations in block 114 in method 100, instead of performing operations in blocks 116 and 118 in method 100, method 500 is employed to form the alternative CPODE structure 650.

Referring to FIGS. 1, 24, and 25A-25B, after forming the dummy liner 236 (shown in FIG. 8A) on the trench 234, method 500 includes a block 510 where a dummy filler 610 is formed on the dummy liner 236 and fills a lower portion of the trench 234. The dummy filler 610 may be formed by a deposition process different from that used to form the dummy liner 236. In some instances, the dummy filler 610 may be deposited using a CVD process, a PVD process, or other suitable deposition process. The dummy filler 610 is also a placeholder layer and would be removed to form an air gap. In one embodiment, the dummy liner 236 may be deposited using ALD while the dummy filler 610 is deposited using CVD. The dummy filler 610 is selected to have a composition different from that of the dielectric filler 620 subsequently formed in the trench 234 to ensure that the dummy liner 236 and the dummy filler 610 possess etch selectivity with respect to the dielectric filler 620. In some embodiments, the dummy filler 610 may include silicon nitride, silicon oxycarbonitride, silicon carbonitride, silicon oxycarbide, silicon oxynitride, other suitable materials, or combinations thereof. In some embodiments, the dummy liner 236 and the dummy filler 610 may be formed of a same material such that they may be removed by a common etching process. In an embodiment, the dummy liner 236 and the dummy filler 610 both include silicon nitride, and the dielectric filler 620 includes silicon oxide. In some embodiments, the deposited dummy filler 610 may be partially etched back to ensure that a top surface of the dummy filler 610 is lower than a top surface of the dummy liner 236. In an embodiment, the dummy filler 610 has a thickness D2 long the Z direction, and a ratio between the thickness D2 of the dummy filler 610 to the depth D1 of the trench 234 (i.e., D2/D1) may be between about 0.3 and about 0.6 such that a satisfactory air gap 630 may be formed to efficiently reduce the parasitic capacitance without significantly affecting the reliability of the workpiece 600 (e.g., without causing collapsing of the dielectric filler 620 during subsequent process steps). In some implementations, given the depth D1 of the trench 234, D2 is between about 150 nm and 1200 nm to form the satisfactory air gap.

Referring to FIGS. 24 and 26A-26B, method 500 includes a block 520 where a dielectric filler 620 is formed on the dummy filler 610 to fill the upper portion of the trench 234. In the present embodiments, the composition and methods for forming the dielectric filler 620 may be in a way similar to those of the dielectric filler 238 described with reference to method 100. A planarization process (e.g., CMP) is then performed to remove excess materials over the ILD layer 224.

Figures 27A, 27B:
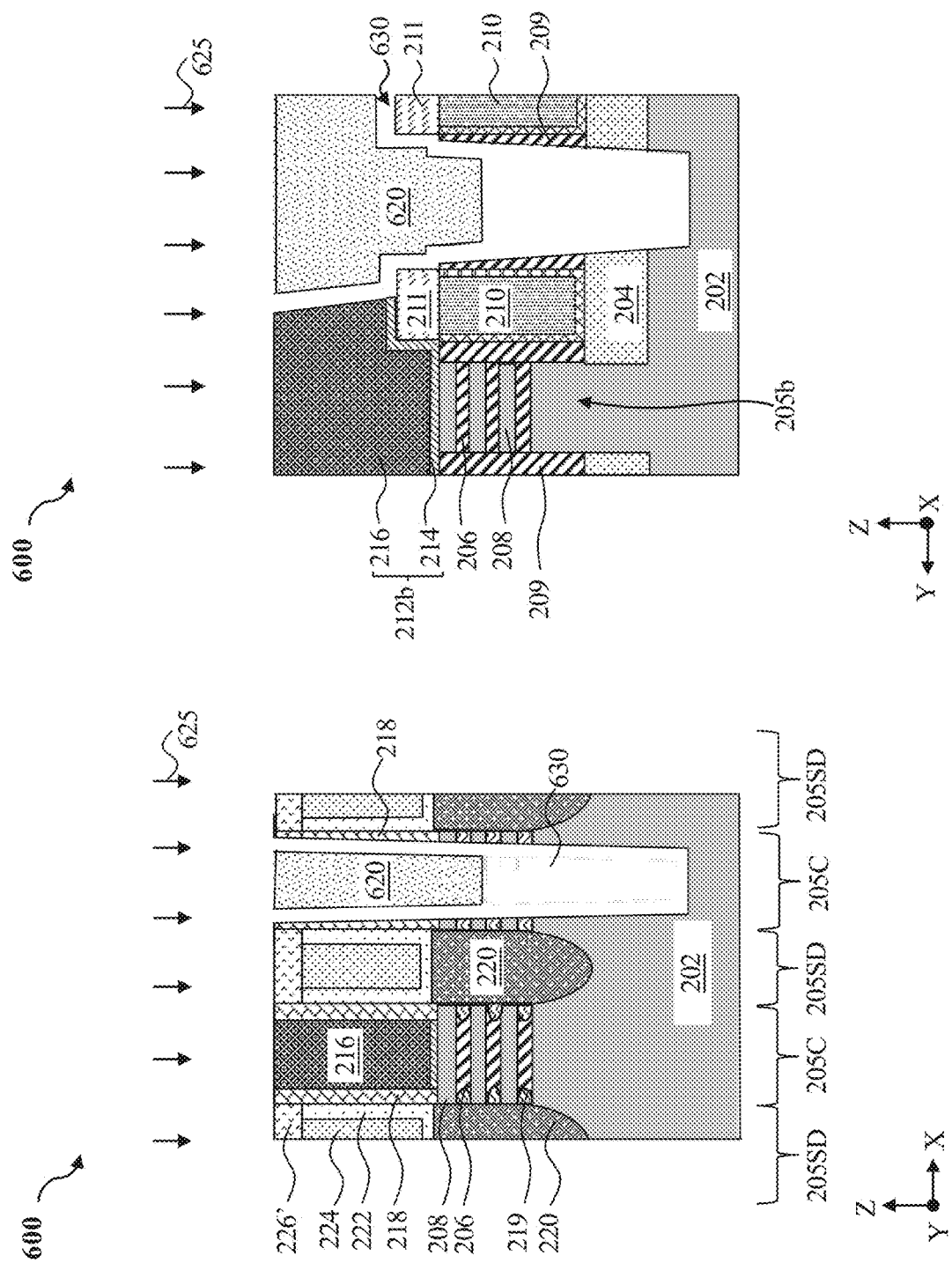

Referring to FIGS. 24 and 27A-27B, method 500 includes a block 530 where an etching process 625 is performed to selectively remove the dummy filler 610 and the dummy liner 236 to form a gap 630. An etching process 625 may be in a way similar to the etching process 242 described with reference to FIGS. 11A-11B. Since the gap 630 is formed by not only by removing the dummy liner 236, but also by removing the dummy filler 610, the volume of the gap 630 is thus greater than the volume of the gap 240 shown in FIG. 11A.

Figures 28A, 28B:
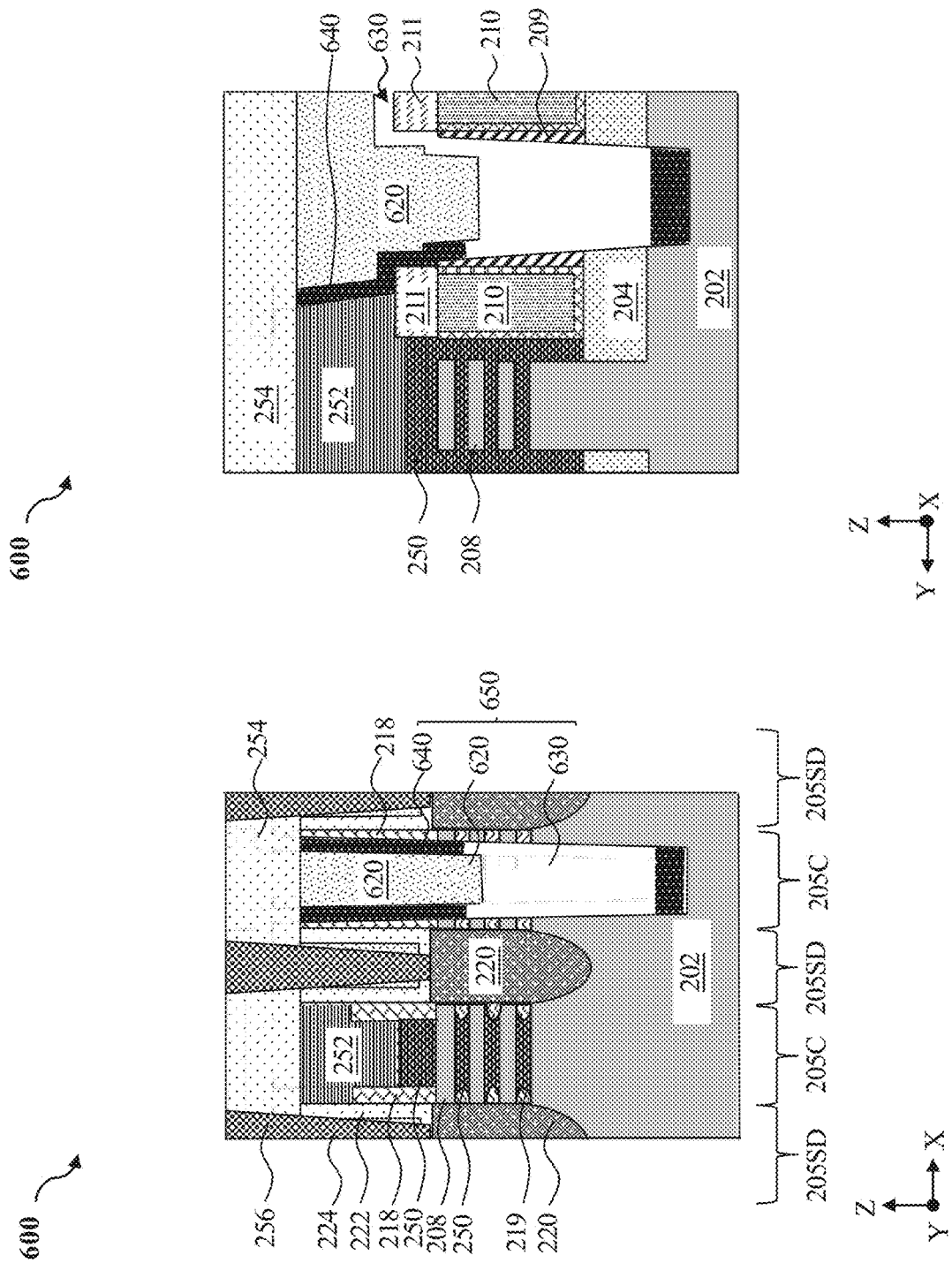

Operations in blocks 120 and 122 of method 100 are then applied to workpiece 600 after forming the gap 630. For example, as shown in FIGS. 28A-28B, the seal plug 640 is formed to penetrate the gap 630 to seal the gap 630 as an air gap 630. The composition and methods for forming the seal plug 640 may be in a way similar to those of the seal plug 244P described with reference to FIGS. 15A-15B. In embodiments represented in FIGS. 28A-28B, the bottom surface of the seal plug 640 is lower than the source/drain features 220 and the helmet layer 211 to provide the workpiece 600 with an improved reliability as described above. The bottom surface of the gap 630 is also covered by a material that is same to the seal plug 640, due to the implement of ALD process for forming the seal plug 640. It is noted that, in some other implementations, the seal plug 640 may have similar configurations as the seal plug 244P described above with reference to FIGS. 14A-14B. The dielectric filler 620, the air gap 630, and the seal plug 640 may be collectively referred to as the CPODE structure 650 or the dielectric gate 650. By increasing the volume of the air gap, the parasitic capacitance of the workpiece 600 is further reduced compared to that of the workpiece 200 shown in FIGS. 15A-15B.

Although not intended to be limiting, one or more embodiments of the present disclosure provide many benefits to a semiconductor structure and the formation thereof. For example, the present disclosure provides an isolation structure, and methods of forming the same, disposed between two device regions and configured to include an air gap. In the present embodiments, besides offering scaling capability to accommodate fabrication of devices at advanced technology nodes, the CPODE structure with the inclusion of the air gap allows reduction of the parasitic capacitance of the devices, thereby improving the overall performance of the devices.

The present disclosure provides for many different embodiments. Semiconductor structures and methods of fabrication thereof are disclosed herein. In one exemplary aspect, the present disclosure is directed to a method. The method includes receiving a workpiece. The workpiece includes a fin-shaped structure protruding from a substrate and having a first channel region and a second channel region, a first dummy gate structure disposed over the first channel region and a second dummy gate structure disposed over the second channel region, and a source/drain feature disposed between the first channel region and the second channel region. The method also includes removing a portion of the first dummy gate structure to form a first trench exposing the first channel region, removing a portion of the first channel region exposed by the first trench and a portion of the substrate directly under the first channel region to extend the first trench, forming a dielectric feature in the extended first trench. The dielectric feature is spaced apart from the source/drain feature by an air gap. The method also includes replacing the second dummy gate structure with a gate stack after the forming of the dielectric feature.

In some embodiments, the forming of the dielectric feature may include forming a dummy liner over a sidewall surface the extended first trench, forming a dielectric filler over the dummy liner to fill the extended first trench, and selectively removing the dummy liner to form a second trench and release the dielectric filler as the dielectric feature. In some embodiments, a dielectric constant of dummy liner may be greater than a dielectric constant of the dielectric filler. In some embodiments, the dummy liner may include silicon nitride, silicon oxycarbonitride, silicon carbonitride, or silicon oxynitride, and the dielectric filler may include silicon oxide. In some embodiments, the method may also include forming a seal material layer over the workpiece. The seal material layer may include a first portion plugging the second trench. A bottom surface of the first portion of the seal material layer may be lower than a top surface of the source/drain feature. In some embodiments, the replacing of the second dummy gate structure with the gate stack may include, after forming the seal material layer, removing the second dummy gate structure without substantially etching the seal material layer, and forming the gate stack over the second channel region. In some embodiments, the dielectric feature may be spaced apart from a rest of the first channel region by the second trench. In some embodiments, the seal material layer may include a second portion disposed on a bottom surface of the extended first trench. In some embodiments, the forming of the dielectric feature further may include, after the forming of the dummy liner, depositing a dummy layer over the dummy liner to fill a bottom portion of the extended first trench. The dielectric filler may be deposited on the dummy layer to fill an upper portion of the extended first trench. The selectively removing of the dummy liner may also remove the dummy layer without substantially removing the dielectric filler.

In another exemplary aspect, the present disclosure is directed to a method. The method includes receiving a workpiece that includes a first active region and a second active region extending from a substrate, a first isolation feature disposed over the substrate and between the first and the second active regions, a second isolation feature disposed on the first isolation feature, and a dummy gate structure includes a first portion over the first active region and a second portion over the second active region. The method also includes removing the first portion of the dummy gate structure and portions of the first active region and the substrate under the first portion of the dummy gate structure to form a trench, forming a dielectric feature in the trench, wherein the dielectric feature may be spaced apart from the second isolation feature by an air gap, and replacing the second portion of the dummy gate structure with a gate stack.

In some embodiments, the first active region and the second active region each include a vertical stack of alternating sacrificial layers and channel layers over the substrate. The workpiece may also include a cladding layer extending along sidewalls of the first active region and the second active region, and the dielectric feature may be spaced apart from the cladding layer by the air gap. In some embodiments, the forming of the dielectric feature may include forming a sacrificial liner over a sidewall surface and a bottom surface of the trench, forming a dielectric filler over the sacrificial liner to fill the trench, and selectively removing the sacrificial liner to form a gap and release the dielectric filler as the dielectric feature. In some embodiments, the method may also include forming a seal material layer over the workpiece to seal the gap, thereby forming the air gap. In some embodiments, a bottom surface of the seal material layer may be in direct contact with a top surface of the second isolation feature. In some embodiments, the dielectric filler may be spaced apart from the second portion of the dummy gate structure by the seal material layer. The replacing of the second portion of the dummy gate structure with the gate stack may include removing the second portion of the dummy gate structure without substantially removing the seal material layer. In some embodiments, the sacrificial liner may include a high-k material and the dielectric filler may include a low-k material.

In yet another exemplary aspect, the present disclosure is directed to a semiconductor structure. The semiconductor structure includes a first dielectric fin and a second dielectric fin over a substrate and extending lengthwise along a first direction, a number of nanostructures over the substrate and disposed adjacent to the first dielectric fin along a second direction substantially perpendicular to the first direction, a gate structure wrapping around each of the number of nanostructures, a dielectric feature disposed between the first dielectric fin and the second dielectric fin and extending into the substrate. The dielectric feature may be spaced apart from the first dielectric fin and the second dielectric fin by an air gap. The semiconductor structure also includes a seal material layer disposed directly over the first dielectric fin and adjacent to the dielectric feature to seal the air gap.

In some embodiments, the semiconductor structure may also include a source/drain feature coupled to each of the number of nanostructures. A bottom surface of the seal material layer may be lower than a top surface of the source/drain feature. In some embodiments, the dielectric feature may be spaced apart from the substrate by the air gap. In some embodiments, the dielectric feature may include a low-k material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece comprising:
        a fin-shaped structure protruding from a substrate and comprising a first channel region and a second channel region,
        a first dummy gate structure disposed over the first channel region and a second dummy gate structure disposed over the second channel region, and
        a source/drain feature disposed between the first channel region and the second channel region;
    removing a portion of the first dummy gate structure to form a first trench exposing the first channel region;
    removing a portion of the first channel region exposed by the first trench and a portion of the substrate directly under the first channel region to extend the first trench;
    forming a dielectric feature in the extended first trench, wherein the dielectric feature is spaced apart from the source/drain feature by an air gap; and
    after the forming of the dielectric feature, replacing the second dummy gate structure with a gate stack.

2. The method of claim 1, wherein the forming of the dielectric feature comprises:
    forming a dummy liner over a sidewall surface the extended first trench;
    forming a dielectric filler over the dummy liner to fill the extended first trench; and
    selectively removing the dummy liner to form a second trench and release the dielectric filler as the dielectric feature.

3. The method of claim 2, wherein a dielectric constant of dummy liner is greater than a dielectric constant of the dielectric filler.

4. The method of claim 2,
    wherein the dummy liner comprises silicon nitride, silicon oxycarbonitride, silicon carbonitride, or silicon oxynitride, and
    wherein the dielectric filler comprises silicon oxide.

5. The method of claim 2, further comprising:
    forming a seal material layer over the workpiece, the seal material layer comprising a first portion plugging the second trench, wherein a bottom surface of the first portion of the seal material layer is lower than a top surface of the source/drain feature.

6. The method of claim 5, wherein the replacing of the second dummy gate structure with the gate stack comprises:
after forming the seal material layer, removing the second dummy gate structure without substantially etching the seal material layer; and
forming the gate stack over the second channel region.

7. The method of claim 6, wherein the dielectric feature is spaced apart from a rest of the first channel region by the second trench.

8. The method of claim 6,
wherein the seal material layer further comprises a second portion disposed on a bottom surface of the extended first trench.

9. The method of claim 2, wherein the forming of the dielectric feature further comprises:
after the forming of the dummy liner, depositing a dummy layer over the dummy liner to fill a bottom portion of the extended first trench,
wherein the dielectric filler is deposited on the dummy layer to fill an upper portion of the extended first trench,
wherein the selectively removing of the dummy liner further removes the dummy layer without substantially removing the dielectric filler.

10. A method, comprising:
receiving a workpiece comprising:
a first active region and a second active region extending from a substrate,
a first isolation feature disposed over the substrate and between the first and the second active regions,
a second isolation feature disposed on the first isolation feature, and
a dummy gate structure comprising a first portion over the first active region and a second portion over the second active region;
removing the first portion of the dummy gate structure and portions of the first active region and the substrate under the first portion of the dummy gate structure to form a trench;
forming a dielectric feature in the trench, wherein the dielectric feature is spaced apart from the second isolation feature by an air gap; and
replacing the second portion of the dummy gate structure with a gate stack.

11. The method of claim 10,
wherein the first active region and the second active region each include a vertical stack of alternating sacrificial layers and channel layers over the substrate,
wherein the workpiece further comprises a cladding layer extending along sidewalls of the first active region and the second active region, and
wherein the dielectric feature is spaced apart from the cladding layer by the air gap.

12. The method of claim 10, wherein the forming of the dielectric feature comprises:
forming a sacrificial liner over a sidewall surface and a bottom surface of the trench;
forming a dielectric filler over the sacrificial liner to fill the trench; and
selectively removing the sacrificial liner to form a gap and release the dielectric filler as the dielectric feature.

13. The method of claim 12, further comprising:
forming a seal material layer over the workpiece to seal the gap, thereby forming the air gap.

14. The method of claim 13, wherein a bottom surface of the seal material layer is in direct contact with a top surface of the second isolation feature.

15. The method of claim 13,
wherein the dielectric filler is spaced apart from the second portion of the dummy gate structure by the seal material layer, and
wherein the replacing of the second portion of the dummy gate structure with the gate stack comprises removing the second portion of the dummy gate structure without substantially removing the seal material layer.

16. The method of claim 12, wherein the sacrificial liner comprises a high-k material and the dielectric filler comprises a low-k material.

17. A method, comprising:
receiving a semiconductor structure comprising:
a channel region directly over a portion of a substrate,
a dummy gate structure directly over the channel region, and
a source/drain feature over the substrate and electrically coupled to the channel region;
removing the dummy gate structure, the channel region, and the portion of the substrate disposed directly under the channel region to form a trench;
forming a dielectric feature in the trench, wherein the dielectric feature is spaced apart from the source/drain feature and the substrate by an air gap, wherein the air gap extends into the substrate.

18. The method of claim 17, wherein the forming of the dielectric feature comprises:
conformal depositing a first dielectric layer, the first dielectric layer partially fills the trench;
forming a second dielectric layer over the first dielectric layer; and
selectively removing the first dielectric layer to form the air gap.

19. The method of claim 17, wherein the channel region comprises a vertical stack of alternating channel layers and sacrificial layers.

20. The method of claim 17,
wherein the dummy gate structure comprises a dummy gate dielectric layer and a dummy gate electrode disposed over the dummy gate dielectric layer, and
wherein the removing of the dummy gate structure, the channel region, and the portion of the substrate disposed directly under the channel region to form the trench comprises:
performing a first etching process to selectively etch the dummy gate electrode to form a first trench; and
performing a second etching process to vertically extend the first trench by removing a portion of the dummy gate dielectric layer exposed by the first trench and removing the channel region and the portion of the substrate disposed directly under the portion of the dummy gate dielectric layer.

* * * * *